US012782424B2

(12) United States Patent
Lee et al.

(10) Patent No.: US 12,782,424 B2
(45) Date of Patent: Nov. 3, 2026

(54) BURN-IN BOARD FOR SEMICONDUCTOR DEVICE AND BURN-IN TEST METHOD USING THE SAME

(71) Applicant: Samsung Electronics Co., Ltd., Suwon-si (KR)

(72) Inventors: Seonhaeng Lee, Suwon-si (KR); Kyungwon Park, Suwon-si (KR); Young-Min Park, Suwon-si (KR); Soodong Lee, Suwon-si (KR); Seungmin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 235 days.

(21) Appl. No.: 18/660,642

(22) Filed: May 10, 2024

(65) Prior Publication Data

US 2025/0224440 A1 Jul. 10, 2025

(30) Foreign Application Priority Data

Jan. 9, 2024 (KR) ........................ 10-2024-0003490

(51) Int. Cl.
*G01R 31/28* (2006.01)

(52) U.S. Cl.
CPC ..... *G01R 31/2875* (2013.01); *G01R 31/2886* (2013.01)

(58) Field of Classification Search
CPC .............. G01R 1/0458; G01R 31/2863; G01R 31/2874; G01R 31/2875; G01R 31/2879; G01R 31/2886
See application file for complete search history.

(56) References Cited

U.S. PATENT DOCUMENTS 5,359,285 A * 10/1994 Hashinaga ......... G01R 31/2874 324/750.08
5,878,486 A 3/1999 Eldridge et al.
6,723,964 B2 4/2004 Hwang et al.
6,900,650 B1 * 5/2005 Sheng ................ G01R 31/2817 324/762.01
6,975,028 B1 * 12/2005 Wayburn ............ F28D 15/0266 257/E23.098
7,042,240 B2 * 5/2006 Lopez ................ G01R 31/2863 374/E1.021
7,257,956 B2 8/2007 Shimada et al.
8,008,934 B2 * 8/2011 Wong ................. G01R 31/2849 324/750.08
8,395,400 B2 3/2013 Nakamura
11,422,158 B2 8/2022 Kim et al.
(Continued)

FOREIGN PATENT DOCUMENTS

KR 10-1049548 B1 7/2011
KR 10-2377170 B1 3/2022

*Primary Examiner* — Vinh P Nguyen
(74) *Attorney, Agent, or Firm* — HARNESS, DICKEY & PIERCE, P.L.C.

(57) ABSTRACT

Various example embodiments relate to a burn-in board and/or a burn-in test method using the same. A burn-in board according to various example embodiments includes a substrate having a first surface and a second surface opposite to each other, and a socket configured to receive a semiconductor device on or at the first surface of the substrate. The first surface of the substrate defines an extension portion extending in a first direction and having an inner space on or at the first surface of the substrate.

20 Claims, 16 Drawing Sheets

(56) References Cited

U.S. PATENT DOCUMENTS

| | | | | |
|---|---|---|---|---|
| 11,614,483 | B2 * | 3/2023 | Yu | G01R 31/2896<br>324/756.02 |
| 11,719,743 | B2 * | 8/2023 | Gopal | G01R 31/2867<br>324/750.09 |

* cited by examiner

BURN-IN BOARD FOR SEMICONDUCTOR DEVICE AND BURN-IN TEST METHOD USING THE SAME

CROSS-REFERENCE TO RELATED APPLICATION

This application claims priority to and the benefit of Korean Patent Application No. 10-2024-0003490 filed in the Korean Intellectual Property Office on Jan. 9, 2024, the entire contents of which are incorporated herein by reference.

BACKGROUND

Various example embodiments relate to a burn-in board and/or a burn-in test method using the same.

A semiconductor device may have a small size while performing various functions, and semiconductor devices are thus widely used in various areas of electronics industry. To test reliability of semiconductor devices, a burn-in test in which various signals and/or voltages, etc. are applied to the semiconductor devices at a high temperature is used.

In the burn-in test, hot air is supplied to the burn-in board. However, it may be difficult to maintain a uniform temperature of the burn-in board during the burn-in test due to a structure of the burn-in board and a structure of a chamber in which the burn-in test is performed. For example, a temperature of an area adjacent to an inlet through which high-temperature air inflows may be higher than a temperature of another area far away from the inlet.

SUMMARY

Various example embodiments attempt to provide a burn-in board capable of improving temperature uniformity in a burn-in test and/r a burn-in test method using the same.

A burn-in board according to some example embodiments includes a substrate having a first surface and a second surface opposite to each other, and a socket configured to receive a semiconductor device on or at the first surface of the substrate. The burn-in board defines a guide portion including an extension portion extending in a first direction to have an inner space on or at the first surface of the substrate.

Alternatively or additionally a burn-in board according to various example embodiments includes a substrate having a first surface and a second surface opposite to each other, a socket configured to receive a semiconductor device on or at the first surface of the substrate, and a heating plate on the first surface of the substrate and spaced apart from the first surface of the substrate.

Alternatively or additionally a burn-in test method according to some example embodiments includes placing a heating plate and a burn-in board including a substrate on which a semiconductor device is mounted in a burn-in test apparatus, and performing a burn-in test of the semiconductor device in a state that air for the burn-in test is supplied. The method includes, in the burn-in test, detecting a temperature of the substrate, and operating the heating plate in response to the temperature of the substrate being lower than a reference temperature, the operating the heat plate causing the temperature of the substrate to increase.

According to various embodiments, temperature uniformity of a burn-in board (e.g., a substrate included in the burn-in board) may be improved in a burn-in test process by including a guide portion that may control a flow of air for the burn-in test. In this instance, a socket connector is positioned so as not to block the flow of the air for the burn-in test, thereby further improving the temperature uniformity of the burn-in board (e.g., the substrate included in the burn-in board). Additionally or alternatively, the burn-in board (e.g., the substrate included in the burn-in board) may be maintained to have a desired temperature in the burn-in test process by a heating plate and a temperature sensor.

DETAILED DESCRIPTION

Figure 1:
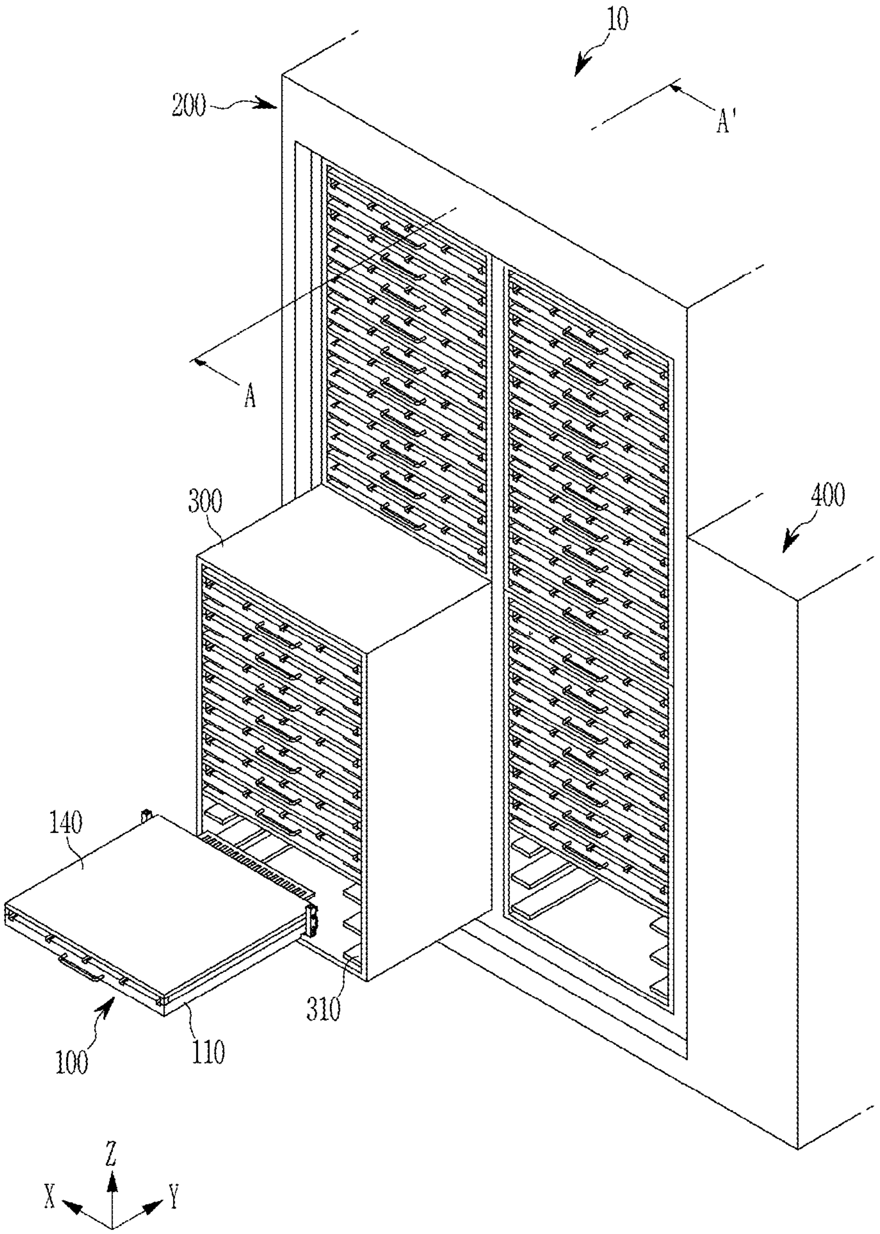
FIG. 1 is a perspective view schematically illustrating an example of a burn-in test device including a burn-in board according to various example embodiments.

Various example embodiments will be described more fully hereinafter with reference to the accompanying drawings for those of ordinary skill in the art to which the present disclosure pertains to easily practice the inventive concepts. Inventive concepts may be implemented in various different forms and is not limited to the embodiments provided herein.

A portion unrelated to the description is omitted in order to clearly describe the present disclosure, and the same or similar components are denoted by the same refer to throughout the present specification.

Further, since sizes and thicknesses of portions, regions, members, units, layers, films, or so on, illustrated in the accompanying drawings may be arbitrarily illustrated for better understanding and convenience of explanation, the present disclosure is not limited to the illustrated sizes and thicknesses. In the drawings, thicknesses of portions, regions, members, units, layers, films, or so on, may be enlarged or exaggerated for convenience of explanation and/or simple illustration.

It will be understood that when a component such as a layer, film, region, or substrate is referred to as being "on" another component, it may be directly on other component or an intervening component may also be present. In contrast, when a component is referred to as being "directly on" another component, there is no intervening component present. Further, when a component is referred to as being "on" or "above" a reference component, a component may be positioned on or below the reference component, and does not necessarily be "on" or "above" the reference component toward an opposite direction of gravity.

In addition, unless explicitly described to the contrary, the word "comprise", "include", or "contain", and variations such as "comprises", "comprising", "includes", "including", "contains" or "containing" will be understood to imply the inclusion of other components rather than the exclusion of any other components.

Further, throughout the specification, a phrase "on a plane", "in a plane", "on a plan view", or "in a plan view" may indicate a case where a portion is viewed from above or a top portion, and a phrase "on a cross-section" or "in a cross-sectional view" may indicate a vertical cross-sectional viewed from a side.

Hereinafter, an example of a burn-in test device including a burn-in board according to various example embodiments will be described with reference to FIG. 1 and FIG. 2, and a burn-in board and a burn-in test method using the same will be described in detail with reference to FIG. 3 to FIG. 9.

FIG. 1 is a perspective view schematically illustrating an example of a burn-in test device including a burn-in board according to various example embodiments. FIG. 2 is a partial cross-sectional view taken along line A-A' of FIG. 1.

Figure 2:
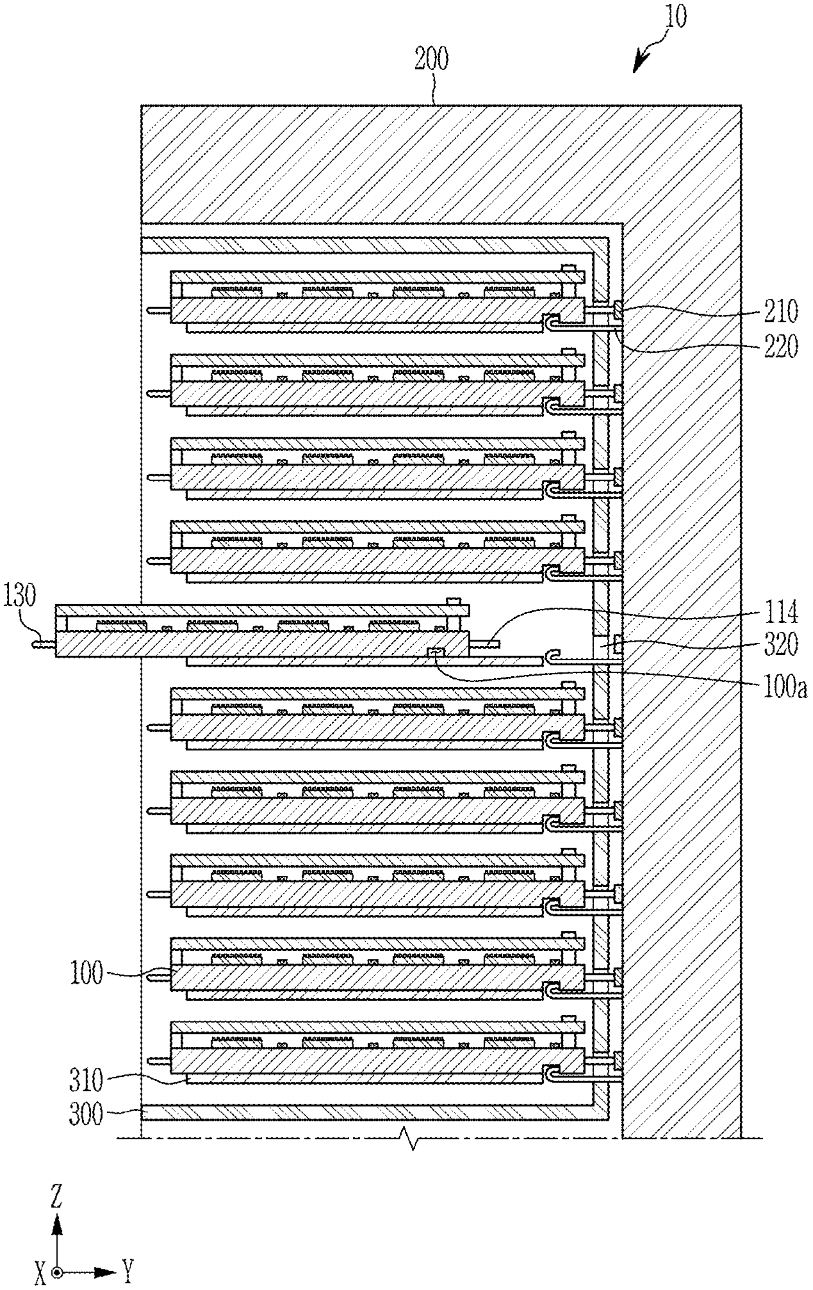
FIG. 2 is a partial cross-sectional view taken along line A-A' of FIG. 1.

Referring to FIG. 1 and FIG. 2, a burn-in test device 10 according to various example embodiments includes a burn-in board 100, a chamber 200 in which a burn-in test is or can be performed, a system rack 300 in the chamber 200, and a controller 400 that controls one or more operations of the chamber 200 and/or the burn-in board 100. The burn-in board 100 may be fixed to the system rack 300.

The chamber 200 may have a space portion in which the burn-in board 100 and/or the system rack 300 is positioned. In various example embodiments, the chamber 200 may include a slot 210 for electrical connection to the burn-in board 100 and a fixing member 220 for fixing the burn-in board 100 on an inner surface of the chamber 200. When the burn-in board 100 and the system rack 300 are mounted in the chamber 200, the space portion of the chamber 200 may be closed by a shutter member. The number of slots 210 is not limited to that shown in the figures, and may be more or less than that shown in the figures.

The system rack 300 may include a plurality of support portions 310 that support a plurality of burn-in boards 100 on an inner surface of the system rack 300. The number of support portions 310 is not limited to what is shown in the figures, and may be more or less than that shown in the figures. The semiconductor device 20 (refer to FIG. 4) may be mounted on a socket 120 (refer to FIG. 3) of the burn-in board 100, and the burn-in board 100 on which the semiconductor device 20 is mounted may be inserted into the system rack 300 through the support portion 310. The burn-in board 100 will be described in more detail later with reference to FIG. 3 to FIG. 8.

The system rack 300 may include a through portion 320 in which a connection terminal 114 of the burn-in board 100 and the fixing member 220 of the chamber 200 are positioned. The connection terminal 114 of the burn-in board 100 may be inserted into the slot 210 of the chamber 200 through the penetration portion 320, and the burn-in board 100 and the chamber 200 may be electrically connected to each other. The fixing member 220 of the chamber 200 may be engaged with a fixing groove 100*a* defined in the burn-in board 100 through the penetration portion 320, and the connection terminal 114 of the burn-in board 100 and the slot 210 of the chamber 200 may be stably fixed. In this instance, a position of the fixing member 220 may be adjusted in a vertical direction and/or a horizontal direction. For example, a position adjustment member (e.g., a cylinder) that adjusts the position of the fixing member 220 may be controlled by the controller 400. The electrical connection structure and the fixation structure of the burn-in board 100 and the chamber 200 are described as an example in the above, but an electrical connection structure and a fixation structure of the burn-in board 100 and the chamber 200 may be modified in various ways.

In FIG. 1, it is illustrated as an example that a plurality of system racks 300 are provided in the chamber 200. However, example embodiments are not limited thereto. In some embodiments, one system rack 300 may be provided in the chamber 200, and/or the burn-in board 100 may be mounted in the chamber 200.

The controller 400 may control some or all operations for a burn-in test. For example, the controller 400 may overall control operations of testing a state of the burn-in board 100 by transmitting electrical signals for the burn-in test to the burn-in board 100 and/or receiving electrical signals for the burn-in test from the burn-in board 100. The controller 400 may overall control an operation of adjusting a temperature in the chamber 200 (e.g., a temperature of a substrate 110). Alternatively or additionally, the controller 400 may control operations for electrically connecting or fixing the burn-in board 100 and the chamber 200.

The burn-in board 100 according to various example embodiments will be described in detail with reference to FIG. 3 and FIG. 4 along with FIG. 1 and FIG. 2.

Figure 3:
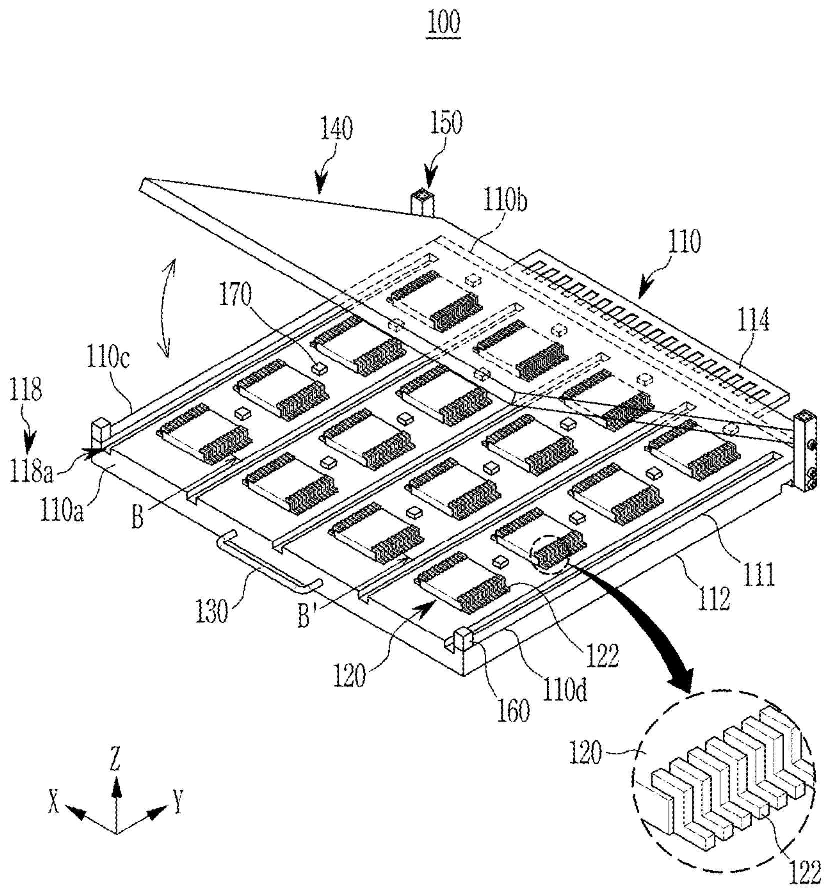
FIG. 3 is a perspective view illustrating a burn-in board according to various example embodiments.

FIG. 3 is a perspective view illustrating a burn-in board 100 according to various example embodiments. FIG. 4 is a cross-sectional view illustrating a state in which a semiconductor device 20 is mounted on the burn-in board 100, taken along line B-B' of FIG. 3.

Referring to FIG. 1 to FIG. 4, in various example embodiments, a burn-in board 100 may include a substrate 110 having a first surface 111 and a second surface 112 that are opposite to each other, and a socket 120 on or at the first surface 111 of the substrate 110. The burn-in board 100 may further include a heating plate 140 including a heating portion 140*a* (refer to FIG. 5) and spaced apart from the first surface 111 of the substrate 110 on the first surface 111 of the substrate 110, and a temperature sensor 170 on or in the substrate 110.

The substrate 110 may be or may include (or be included in) a connection substrate, a connection board, a circuit board, or a wiring board. The substrate 110 may support the socket 120 and may include a wiring 116 (refer to FIG. 6) electrically connected to the socket 120 (e.g., a socket connector 122), the temperature sensor 170, and a hinge member 150. For example, the substrate 110 may be a printed circuit board (PCB). However, example embodiments are not limited thereto, and the substrate 110 may have any of various structures and/or materials, or so on.

The substrate 110 may include a handle 130 at a first side 110*a* of the substrate 110, and a connection terminal 114 at a second side 110*b* of the substrate 110 opposite to the first side 110*a* of the substrate 110. When the burn-in board 100 is fixed to the chamber 200, the first side 110*a* of the substrate 110 may be an outer side of the burn-in board 100 or an inlet side of the burn-in board 100 through which air for a burn-in test (e.g., high-temperature air) inflows, and the second side 110*b* of the substrate 110 may be an inner side of the burn-in board 100 or an opposite side opposite to the inlet side.

In a plan view, the first side 110*a* and the second side 110*b* may be at both sides of the substrate 110 in the first direction (a Y-axis direction in FIG. 2). In this instance, the first direction corresponds to a direction from the inlet side to the opposite side, and may correspond to a main axis direction of the air for the burn-in test, which is the direction in which a relatively large amount of the air for the burn-in test flows among directions in which the air for the burn-in test flows. In a plan view, a second direction (an X-axis direction in the drawing) may be a direction that is transverse to (e.g., perpendicular to) the first direction. A thickness direction (a Z-axis direction in the drawing) may intersect (e.g., be perpendicular to) a plane where the first direction and the second directions are positioned.

The handle 130 at the first side 110*a* of the substrate 110 may be used to move the burn-in board 100. For example, when an operator and/or an auto guided vehicle (AGV) inserts the burn-in board 100 into the system rack 300 and/or brings out the burn-in board 100 from the system rack 300, the handle 130 may be used. However, example embodiments are not limited thereto. In some embodiments, the handle 130 might not be provided.

The connection terminal 114 at the second side 110*b* of the substrate 110 may have a connection pattern electrically connected to the wiring 116 of the substrate 110. The connection terminal 114 may have any of various structures that may be inserted into the slot 210 of the chamber 200 and electrically connected to the chamber 200. In this instance, the connection terminal 114 (e.g., the connection pattern) may be electrically connected to the socket connector 122, the heating plate 140 (more particularly, the heating portion 140*a*), and the temperature sensor 170 through the wiring 116 of the substrate 110. In this instance, the heating plate 140 may be electrically connected to the wiring 116 of the substrate 110 through the hinge member 150 (more particularly, a wiring pattern 152 (refer to FIG. 5)). This will be explained in more detail later.

The semiconductor device 20 may be mounted on the socket 120. The socket 120 may be at a side of the first surface 111 of the substrate 110 and may be fixed to the first surface 111 in various ways. For example, the semiconductor device 20 may be inserted into and mounted on the socket 120, but example embodiments are not limited thereto.

A plurality of sockets 120 may be provided in each of the first and second directions in a plan view. For example, the plurality of sockets 120 may form a matrix having a plurality of rows spaced apart from each other in the first direction and a plurality of columns spaced apart from each other in one row in the second direction. The number of rows may be the same as, less than, or greater than the number of columns.

The socket 120 may include the socket connector 122=electrically connected to a lead 22 of the semiconductor device 20 and the wiring 116 of the substrate 110. As illustrated in FIG. 4, when the semiconductor device 20 is mounted on the socket 120, the lead 22 of the semiconductor device 20 may be electrically connected to (e.g., in contact with) the socket connector 122.

Figure 4:
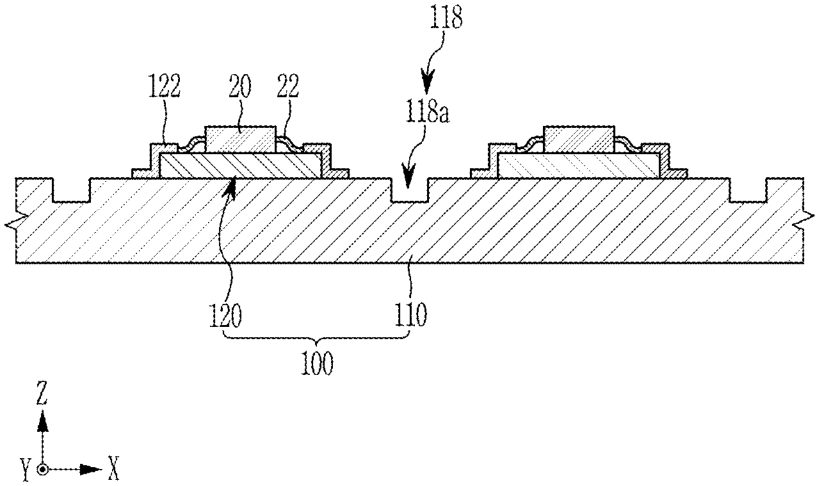
FIG. 4 is a cross-sectional view illustrating a state in which a semiconductor device is mounted on the burn-in board, taken along line B-B' of FIG. 3.

For a clear understanding and simple illustration, FIG. 4 schematically illustrates a structure of the socket 120, and a connection structure of the lead 22 of the semiconductor device 20 and the socket connector 122. Example embodiments are not limited thereto. Accordingly, the socket 120 may have any of various structures on which the semiconductor device 20 is mounted, and the connection structure of the lead 22 of the semiconductor device 20 and the socket connector 122 may be modified in various ways.

One or more burn-in test signals transmitted from the controller 400 may be transmitted to the semiconductor device 20 mounted on the socket 120 through the connection terminal 114, the wiring 116 of the substrate 10, and the socket connector 122. One or more output signals to the burn-in test signal may be transmitted to the controller 400 through the socket connector 122, the wiring 116, and the connection terminal 114. Further, a temperature measured by the temperature sensor 170 may be transmitted to the controller 400 through the wiring 116 and the connection terminal 114, and a signal that controls an operation of the heating plate 140 may be transmitted to the heating plate 140 through the connection terminal 114, the wiring 116, and the hinge member 150 (more particularly, the wiring pattern 152). This will be explained in more detail later.

In various example embodiments, a guide portion 118 including an extension portion extending in the first direction (the Y-axis direction in the drawing) may be defined on or at the first surface 111 of the substrate 110. More particularly, the guide portion 118 or the extension portion may have an inner space and/or may form an inner space.

Accordingly, the extension portion of the guide portion 118 may extend in the first direction, which is the main axis direction of the air for the burn-in test, and the air for the burn-in test may flow, e.g., may laminarly flow and/or may turbulently flow, along an extension direction of the guide portion 118. For reference, the first surface 111 of the substrate 110 may refer to a surface of the substrate 110 where the socket 120 is positioned in a portion where the guide portion 118 is not positioned.

More particularly, the guide portion 118 may extend in the first direction (the Y-axis direction in the drawing). For example, the guide portion 118 may extend longitudinally from the first side 110*a* of the substrate 110 to the second side 110*b* of the substrate 110. In this instance, the guide portion 118 may extend to a portion where the connection terminal 114 is not provided at the second side 110*b* of the substrate 110. As such, an entire portion of the guide portion 118 may include or be formed of the extension portion extending in the first direction. Accordingly, the entire portion of the guide portion 118 may extend in the main axis direction of the air for the burn-in test.

In various example embodiments, a plurality of guide portions 118 are provided in the second direction that is transverse to (e.g., perpendicular to) the first direction (the X-axis direction in the drawing), and the plurality of guide portions 118 may extend in the first direction to be parallel to each other.

For example, the guide portion 118 may include an inner guide portion extending in the first direction (the Y-axis direction in the drawing) between two adjacent sockets 120, among the plurality of sockets 120, adjacent to each other in the second direction (the X-axis direction in the drawing). For example, a plurality of inner guide portions, each extending in the first direction (the Y-axis direction in the drawing) between two adjacent sockets 120, among the plurality of sockets 120, adjacent to each other in the second direction (the X-axis direction in the drawing) may be included. For example, the guide portion 118 may include an outer guide portion extending in the first direction (the Y-axis direction in the drawing) between an edge (e.g., a third side 110*c* or a fourth side 110*d*) of the substrate 110 and the socket 120 adjacent to the edge of the substrate 110 in the second direction (the X-axis direction of the drawing). For example, an outer guide portion extending in the first direction (the Y-axis direction in the drawing) between the third side 110*c* and a socket 120 adjacent to the third side 110*c* in the second direction (the X-axis direction in the drawing), and another guide portion extending in the first direction between the fourth side 110*d* and another socket 120 adjacent to the fourth side 110*d* in the second direction may be included.

The guide portion 118 may control the flow of the air for the burn-in test to maintain an entire area of the burn-in board 100 at a uniform temperature. More particularly, the air for the burn-in test may be laminarly and/or turbulently transmitted from the first side 110*a* of the substrate 110 to the second side 110*b* of the substrate 110 through the inner space of the guide portion 118. In some example embodiments, the inner space of the guide portion 118 may form a passage that directly transfers the air for the burn-in test from the first side 110*a* of the substrate 110 to the second side 110*b* of the substrate 110. In this instance, the air for the burn-in test flowing from the first side 110*a* of the substrate 110 to the second side 110*b* of the substrate 110 through the inner space of the guide portion 118 may spread to both sides of the inner space of the guide portion 118 while the air for the burn-in test moves. As a result, the air for the burn-in test may be uniformly provided to areas where the sockets 120 are positioned at both sides of the guide portion 118.

The guide portion 118 is at an edge portion of the socket 120 and/or between two adjacent sockets 120, and thus, a separate space for the guide portion 118 is not needed. Alternatively or additionally, the guide portion 118 is adjacent to the socket 120, and thus, the air for the burn-in test may be stably provided to the socket 120 on which the semiconductor device 20 is mounted. As described above, when the plurality of guide portions 118 extending in the first direction are provided, a temperature uniformity of the substrate 110 may be further improved.

In various example embodiments, a width of the inner space of the guide portion 118 may be greater than a depth of the inner space of the guide portion 118. The width of the inner space of the guide portion 118 may refer to a width in a direction that is transverse to (e.g., perpendicular to) the first direction (the Y-axis direction in the drawing), which is the extension direction of the extension portion, or a width in the second direction (the X-axis direction in the drawing). For example, the width of the inner space of the guide portion 118 may refer to a maximum width or an average width. The depth of the inner space of the guide portion 118 may refer to a depth in the thickness direction (the Z-axis direction in the drawing). For example, the depth of the inner space of the guide portion 118 may refer to a maximum depth and/or to an average depth (such as a mean depth).

When the width of the inner space of the guide portion 118 is greater than the depth of the inner space of the guide portion 118, the air for the burn-in test may move along the inner space of the guide portion 118 and may widely spread to both sides of the guide portion 118. As a result, the temperature of the substrate 110 may be uniformly maintained in the burn-in test. However, example embodiments are not limited thereto. In some example embodiments, the width of the inner space of the guide portion 118 may be the same as or less than the depth of the inner space of the guide portion 118.

In various example embodiments, the guide portion 118 may include or be formed of a groove 118*a* on or at the first surface 111 of the substrate 110. A space inside the groove 118*a* may constitute the inner space of the guide portion 118. The groove 118*a* may be referred to as a concave, a passage through which the air for the burn-in test flows, an air guide groove, an air groove, or so on.

In the drawings, it is illustrated as an example that the inner space of the guide portion 118 or the groove 118*a* has a rectangular cross-sectional shape. According to this, the inner space may have a relatively large volume and the groove 118*a* may have a stable structure. However, example embodiments are not limited thereto, and a shape of the inner space of the guide portion 118 or the groove 118*a* may be modified in various ways. For example, a cross-sectional shape of the inner space of the guide portion 118 or the groove 118*a* may have a rounded portion and/or may have a polygonal shape other than the rectangular shape.

When the guide portion 118 includes or is formed of the groove 118*a* on or at the first surface 111, a volume where the air for the burn-in test is positioned and an area of the first surface 111 of the substrate 110 where the air for the burn-in test is in contact may be increased. Accordingly, the temperature uniformity of the substrate 110 may be further improved by the guide portion 118. Further, the guide portion 118 having the inner space may be formed through a simple process. For example, the groove 118*a* may be formed by any of various methods such as grinding, etching, or so on; alternatively or additionally certain features may be 3D-printed. However, example embodiments are not limited thereto, and the groove 118*a* constituting the guide portion 118 may be formed by any of various methods.

In the drawings, it is illustrated as an example that the entire portion of the guide portion 118 includes or is formed of the extension portion extending in the first direction (the Y-axis direction in the drawing) and does not include a portion in a direction that is transverse to the first direction. However, example embodiments are not limited thereto. In some example embodiments, the guide portion 118 may include a portion formed in a direction that is transverse to the first direction.

In various example embodiments, the socket connector 122 may be positioned so as not to interfere with the air for the burn-in test. For example, the socket connector 122 is not provided at an edge (e.g., a first side and a second side) of the socket 120 that is transverse to the first direction (the Y-axis direction in the drawing). The socket connector 122 may be provided at an edge (i.e., a third side and a fourth side) of the socket 120 parallel to the first direction (the Y-axis direction in the drawing). Since the socket connector 122 is not provided at the edge of the socket 120 (e.g., the first side and/or the second side of the socket 120) that is transverse to the first direction, which is the main axis direction of the air for the burn-in test, the air for the burn-in test may flow without interference from the socket connector 122. In some example embodiments, in various example embodiments, a temperature difference of the substrate 110 may be improved by preventing or suppressing, or reducing, an air stuck phenomenon caused by the socket connector 122.

On the other hand, when a socket connector is provided at an edge of a socket (e.g., a first side or a second side of the socket) that is transverse to a first direction, which is a main axis direction of air for a burn-in test, an air stuck phenomenon that the air of the burn-in test is blocked by the socket connector may occur during the air for the burn-in test flows. If a plurality of sockets are positioned in the first direction, the air stuck phenomenon may become more severe as the air for the burn-in test moves from an inlet side to an opposite side. Accordingly, a temperature of an area (an area adjacent to the opposite side) is lower than a temperature of another area (e.g., an area adjacent to the inlet side), and thus, a temperature difference of the burn-in board may be large.

In some example embodiments, an aerodynamic structure of the burn-in board 100 may be improved by including the guide portion 118 and adjusting the position of the socket connector 122. As a result, the temperature of the substrate 110 may be or made more likely to be maintained uniformly during the burn-in test.

In various example embodiments, the substrate 110 may include a first connecting member for electrically connecting the wiring 116 of the substrate 110 and the hinge member 150. The first connecting member will be described in more detail after the hinge member 150 is described.

In various example embodiments, the heating plate 140 may be fixed on the first surface 111 of the substrate 110 by the hinge member 150 and a support member 160. The heating plate 140, the hinge member 150, the support member 160, and a fastening member 180 will be described in more detail with reference to FIG. 5 along with FIG. 3.

Figure 5:
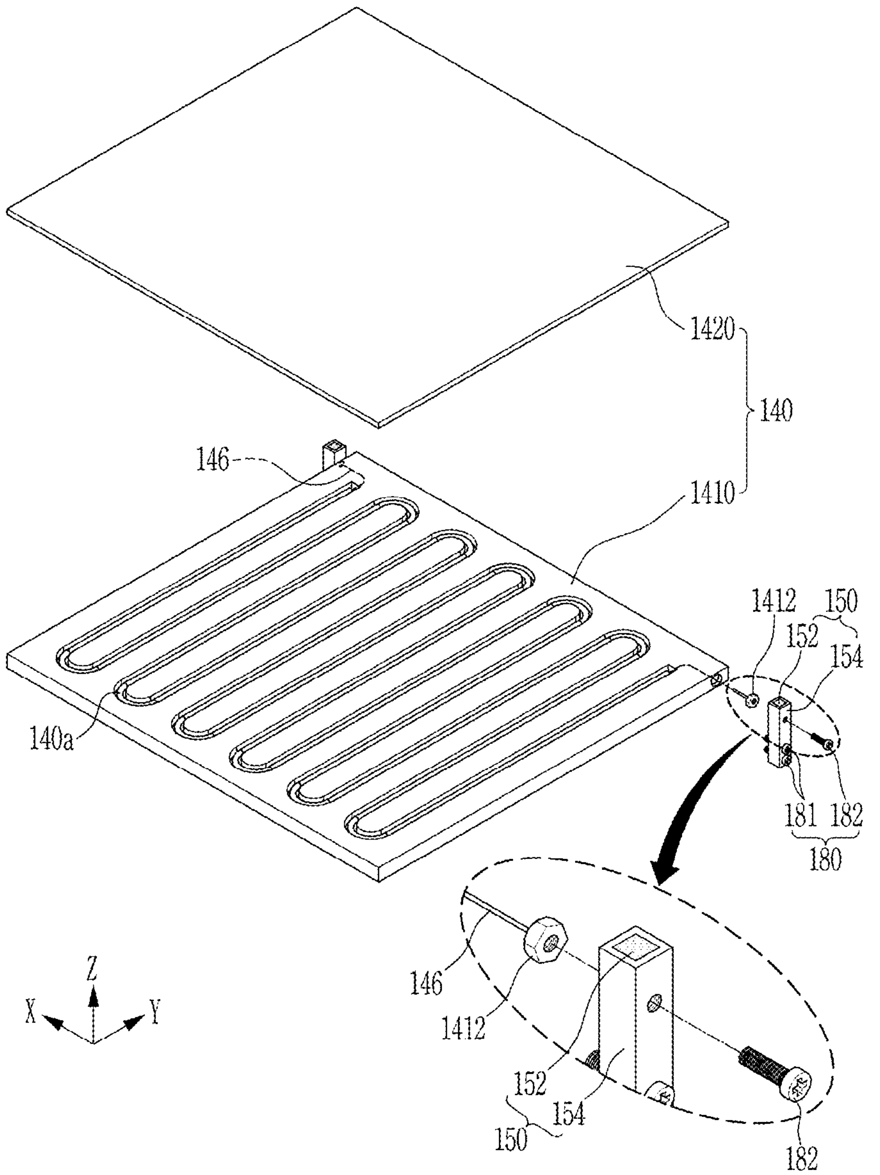
FIG. 5 is an exploded perspective view illustrating a heating plate, a hinge member, and a fastening member included in the burn-in board illustrated in FIG. 3.

FIG. 5 is an exploded perspective view illustrating the heating plate 140, the hinge member 150, and the fastening member 180 included in the burn-in board 100 illustrated in FIG. 3.

Referring to FIG. 3 and FIG. 5, in some example embodiments, the heating plate 140 may be spaced apart from the first surface 111 of the substrate 110 and the socket 120 at a certain distance in the thickness direction (the Z-axis direction of the drawing) by the hinge member 150 and the support member 160. The heating plate 140 may be spaced apart from the substrate 110 to uniformly transfer heat to the substrate 110.

The heating plate 140 may be fixed on the substrate 110 to be openable. More particularly, the burn-in board 100 may have a closed state and an open state. In the closed state, the burn-in board 100 may have a relatively small thickness. In the open state, at least a partial portion of the heating plate 140 may be far away from the substrate 110 than in the closed state. For example, a relative distance of at least the partial portion of the substrate 110 and the heating plate 140 may change. For example, a first side of the heating plate 140 may be rotatably fixed to the hinge member 150, and a second side of the heating plate 140 opposite to the first side of the heating plate 140 may be movably on the substrate 110 so that a distance between the heating plate 140 and the substrate 110 changes.

The heating plate 140 may have the closed state when the burn-in board 100 is in the system rack 300. In the closed state, the first side of the heating plate 140 is fixed to or supported by the hinge member 150, and other portion of the heating plate 140 (e.g., the second side of the heating plate 140) may be supported by the support member 160 on the substrate 110. Accordingly, in the closed state, the burn-in board 100 including the substrate 110 and the heating plate 140 may have a relatively small thickness or a constant thickness.

The heating plate 140 may have the open state when mounting the semiconductor device 20 on the socket 120 or when separating the semiconductor device 20 from the socket 120. In the open state, the heating plate 140 may be spaced apart from the support member 160 of the substrate 110, and the heating plate 140 may be far away from the substrate 110.

For example, the heating plate 140 may be opened and closed by an operator or an auto guided vehicle. For example, the heating plate 140 may further include a structure that may automatically open and close the heating plate 140.

The heating plate 140 may have any of various structures capable of heating the substrate 110. For example, the heating plate 140 may include a first portion 1410 in which the heating portion **140*a* is positioned, and a second portion 1420 covering the first portion 1410. In FIG. 5, it is illustrated as an example that a groove portion is on or at a surface the first portion 1410 facing the second portion 1420 and the heating portion 140*a* is in the groove portion. As a result, the heating plate 140 including the heating portion 140*a* may have a simple and stable structure. However, example embodiments are not limited thereto, and a structure of the heating plate 140 including the heating portion 140*a* may be modified in various ways. For example, the heating portion 140*a* may be physically fixed to the first portion 1410 and might not include the second portion 1420**. Various other modifications are possible.

In various example embodiments, the first portion 1410 may include a second connecting member 1412 that is electrically connected to the heating portion **140*a*. For example, a connection wire 146 connected to the heating portion 140*a* may be connected to the second connecting member 1412**.

The first portion 1410 and the second portion 1420 may include or be formed of a material that does not deform or form contaminants at a temperature of a burn-in test process. For example, the first portion 1410 or the second portion 1420 may include any of various materials such as ceramic or metal. The heating portion **140*a* may have any of various structures capable of heating the substrate 110. For example, the heating portion 140*a*** may include a heating wire, a heat pipe, or so on.

In various example embodiments, the hinge member 150 may physically fix the substrate 110 and the heating plate 140 and electrically connect the wiring 116 of the substrate 110 and the heating plate 140.

In this instance, the substrate 110 may be fixed to the hinge member 150 in a fixed state, and the heating plate 140 may be rotatably fixed to the hinge member 150. In FIG. 5, it is illustrated as an example that a side surface of the hinge member 150 is fixed to a side surface of the substrate 110 and the heating plate 140 is between two hinge members 150 at both sides. However, example embodiments are not limited thereto, and an arrangement of the hinge member 150, the substrate 110, and the heating plate 140 may be modified in various ways.

The hinge member 150 may include a wiring pattern 152. For example, the hinge member 150 may include a body portion 154 and a wiring pattern 152 in the body portion 154. In this instance, the hinge member 150 including the wiring pattern 152 may be formed by any of various methods. In some embodiments, a wiring pattern 152 having a wire shape may be in the body portion 154 having an empty space and be soldered to form a hinge member having the wiring pattern 152 in the body portion 154. In some embodiments, the hinge member 150 including the wiring pattern 152 may include or be formed of a printed circuit board. For example, the wiring pattern 152 may include a conductive material (e.g., metal).

The fastening member 180 may include a first fastening member 181 that fastens the substrate 110 and the hinge member 150, and a second fastening member 182 that fastens the heating plate 140 and the hinge member 150.

The wiring pattern 152 may be electrically connected to the substrate 110 (e.g., the wiring 116) and be electrically connected to the heating plate 140 (e.g., the heating portion 140*a* or the connection wiring 146). In various example embodiments, the hinge member 150 may be electrically connected to the substrate 110 by the first fastening member 181 and may be electrically connected to the heating plate 140 by the second fastening member 182.

By fastening the first fastening member 181 to the first connecting member provided on the substrate 110, the wiring pattern 152 of the hinge member 150 and the wiring 116 of the substrate 110 may be electrically connected to each other. For example, the first connecting member may be at a side of the third side 110*c* and/or the fourth side 110*d* of the substrate 110, and the first connecting member may have the same or similar structure or shape as the second connecting member 1412. As illustrated in FIG. 5, when a plurality of first fastening members 181 are provided, at least one of the plurality of first fastening members 181 may electrically connect the wiring pattern 152 and the wiring 116.

By fastening the second fastening member 182 to the heating plate 140 (e.g., the second connecting member 1412 electrically connected to the connecting wiring 146), the wiring pattern 152 of the hinge member 150 and the heating portion 140*a* of the heating plate 140 may be electrically connected to each other.

For example, the first fastening member 181 or the second fastening member 182 has a screw shape, and the first connecting member provided on the substrate 110 or the second connecting member 1412 may have a nut shape that may be fastened to the first fastening member 181 or the second fastening member 182. An inner surface of the first second connecting member or the second connecting member 1412 may be provided with an inner screw thread coupled to an outer screw thread on an outer surface of the first fastening member 181 or the second fastening member 182. According to this, the hinge member 150 and the substrate 110, and the hinge member 150 and the heating plate 140 may be physically and electrically connected with a simple structure.

However, example embodiments are not limited thereto, and a structure physically and electrically connecting the hinge member 150 and the substrate 110, and/or a structure physically and electrically connecting the hinge member 150 and the heating plate 140 may be modified in various ways. In some embodiments, a structure physically connecting the hinge member 150 and the substrate 110 may be provided separately from a structure electrically connecting the hinge member 150 and the substrate 110, and/or a structure physically connecting the hinge member 150 and the heating plate 140 may be provided separately from a structure electrically connecting the hinge member 150 and the heating plate 140. In various example embodiments, the wiring pattern 152 of the hinge member 150 may be connected to the heating portion 140*a* and/or the wiring 116 of the substrate 110 through an additional wiring, or the wiring pattern 152 of the hinge member 150 may be directly connected to the heating portion 140*a* and/or the wiring 116 of the substrate 110. Various other modifications are possible.

In the drawing, it is illustrated as an example that one first fastening member 181 is provided to rotatably fix the heating plate 140 to the hinge member 150, and a plurality of second fastening members 182 are provided to fix the substrate 110 and the hinge member 150 in the fixed state. However, example embodiments are not limited thereto. Therefore, any of various structures that may rotatably fix the heating plate 140 to the hinge member 150 may be applied, and any of various structures that may fix the substrate 110 and the hinge member 150 in the fixed state may be applied.

The support member 160 may support the heating plate 140 so that the heating plate 140 is spaced apart from the first surface 111 of the substrate 110 and the socket 120. For example, the support member 160 may be in a corner area on the first surface 111 of the substrate 110, thereby minimizing interference with the socket 120 on or at the substrate 110 and the guide portion 118 on or at the substrate 110. In the drawing, it is illustrated as an example that a plurality of support members 160 are in each of corner areas adjacent to an edge opposite to the hinge member 150, but example embodiments are not limited thereto. The support member 160 may be positioned in any of various positions to support the heating plate 140 in the closed state. In some embodiments, a plurality of support members 160 may be at regular intervals at one edge. Various other modifications are possible.

In various example embodiments, the temperature sensor 170 may be on or in the substrate 110. For example, the temperature sensor 170 may detect a temperature of the burn-in board 100 or the substrate 110 in real-time. The temperature sensor 170 may have any or various structures, types, kinds, or so on that detects (e.g. detects in real-time) the temperature. The temperature sensor 170 may be electrically connected to the wiring 116 of the substrate 110.

The temperature sensor 170 may be between the plurality of sockets 120 in the first direction (the Y-axis direction in the drawing). This is because the guide portion 118 is not provided between the plurality of sockets 120 adjacent to each other in the first direction (the Y-axis direction in the drawing), and thus, a sufficient space for the temperature sensor 170 may be secured. However, example embodiments are not limited thereto and the temperature sensor 170 may be at any of various positions. The temperature sensor 170 may be mounted on the first surface 111 of the substrate 110 or may be in the substrate 110.

In the drawing, it is illustrated as an example that a plurality of temperature sensors 170 are provided in one-to-one arrangement with a plurality of sockets 120. According to this, a temperature distribution of the burn-in board 100 or the substrate 110 may be precisely measured by the temperature sensors 170. However, example embodiments are not limited thereto, and one temperature sensor 170 may be provided in an area corresponding to the plurality of sockets 120 or the plurality of sockets 120.

The temperature sensor 170 may be electrically connected to the connection terminal 114 through the wiring 116 of the substrate 110. Accordingly, the temperature measured by the temperature sensor 170 may be transmitted to the controller 400.

In the embodiment, the temperature in the burn-in test process may be appropriately controlled or maintained by the heating portion 140*a*. In this instance, the temperature in the burn-in test process may be detected in real-time by the temperature sensor 170 and be used appropriately to control or maintain the temperature of the substrate 110.

An electrical connection structure of the burn-in board 100 and an arrangement of the heating plate 140 or the heating portion 140*a* with respect to the substrate 110 according to various example embodiments will be described in detail with reference to FIG. 6 and FIG. 7 along with FIG. 3 and FIG. 5.

Figure 6:
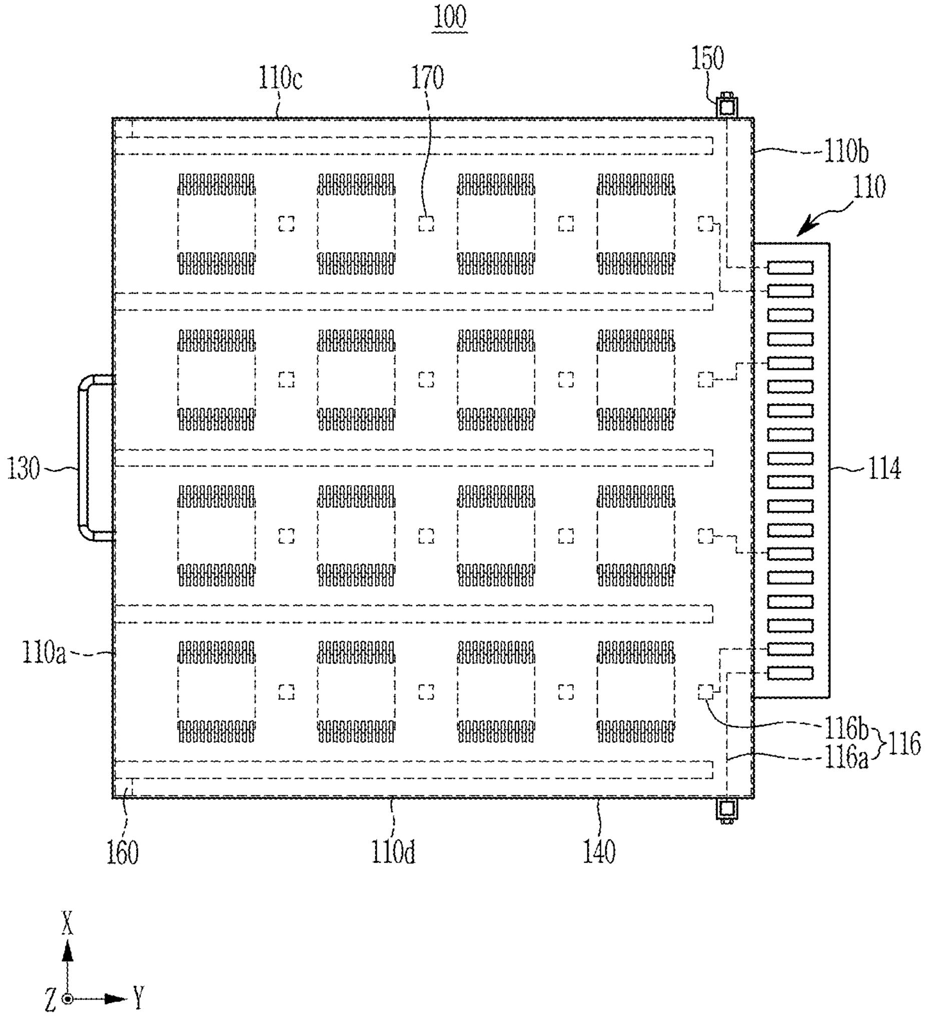
FIG. 6 is a plan view schematically illustrating the burn-in board illustrated in FIG. 3.

FIG. 6 is a plan view schematically illustrating the burn-in board 100 illustrated in FIG. 3. FIG. 7 is a plan view schematically illustrating the heating plate 140 and the hinge member 150 included in FIG. 3. For a clear understanding and simple illustration, in FIG. 6, the first fastening member 181, the second fastening member 182, the first connecting member, and the second connecting member 1412 are omitted, and a portion for the description of the wiring of the substrate 110 is mainly illustrated. For a clear understanding and simple illustration, in FIG. 7, a position of the heating portion 140*a* is mainly illustrated, and the second fastening member 182 and the second connecting member 1412 are omitted.

Figure 7:
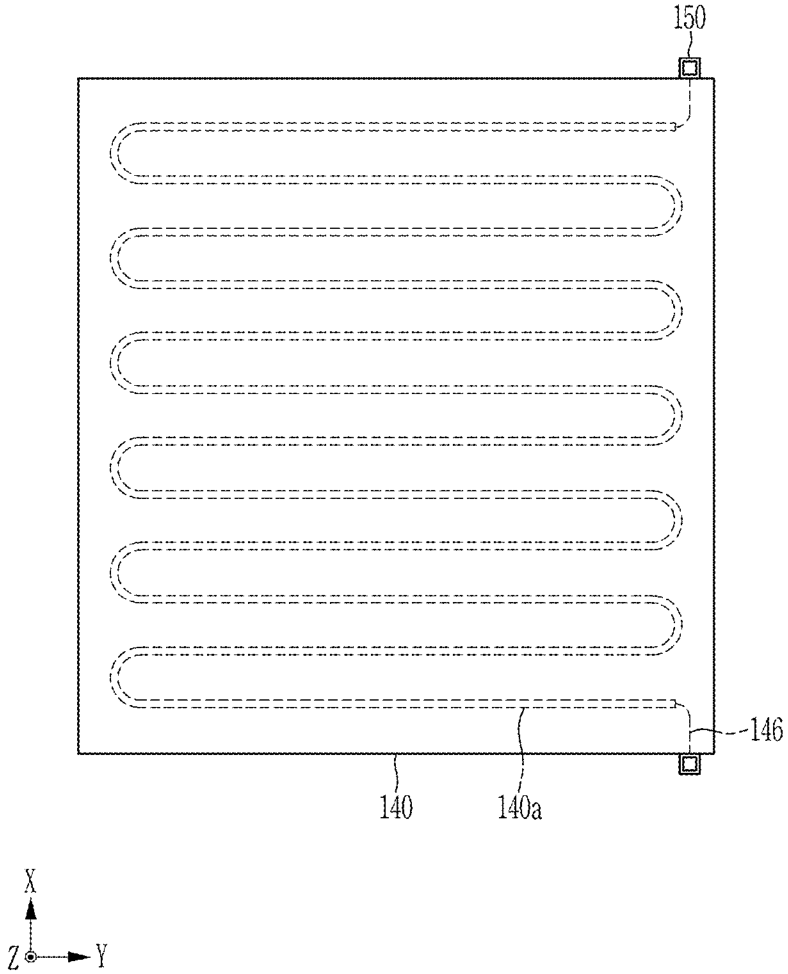
FIG. 7 is a plan view schematically illustrating the heating plate and the hinge member included in FIG. 3.

Referring to FIG. 6 and FIG. 7, in some example embodiments, the wiring 116 of the substrate 110 may include a first wiring 116*a* and a second wiring 116*b*. The first wiring 116*a* may electrically connect the wiring pattern 152 of the hinge member 150 and the connection terminal 114. The second wiring 116*b* may electrically connect the temperature sensor 170 and the connection terminal 114.

Accordingly, the wiring pattern 152 of the hinge member 150 electrically connected to the heating plate 140 may be connected to the connection terminal 114 through the first wiring 116*a*, and the temperature sensor 170 may be connected to the connection terminal 114 through the second wiring 116*b*. When the connection terminal 114 of the burn-in board 100 is inserted into the slot 210 (refer to FIG. 2) of the chamber 200 (refer to FIG. 1), the heating plate 140 and the temperature sensor 170 may be connected to the chamber 200. Accordingly, operations of the heating plate 140 and the temperature sensor 170 may be controlled by the controller 400.

In various example embodiments, one heating plate 140 may be provided to cover an entire area of the substrate 110.

In FIG. 6, it is illustrated as an example that the hinge members 150 are adjacent to the second side 110*b* of the substrate 110, and the support members 160 are adjacent to the first side 110*a* of the substrate 110. More particularly, the hinge members 150 may be on side surfaces of the third side 110*c* and the fourth side 110*d* adjacent to the second side 110*b*. Accordingly, the opening and closing operation of the heating plate 140 by an operator or the like may be easily performed. However, example embodiments are not limited thereto, and the hinge member 150 may be adjacent to the first side 110*a* of the substrate 110 and the support member 160 may be adjacent to the second side 110*b* of the substrate 110. In some example embodiments, the hinge member 150 may be adjacent to the third side 110*c* or the fourth side 110*d* of the substrate 110, and the support member 160 may be adjacent to the fourth side 110*d* or the third side 110*c* of the substrate 110.

In FIG. 7, it is illustrated as an example that the heating portion 140*a* of the heating plate 140 uniformly curves and/or serpentines around an entire area of the substrate 110.

Figure 8:
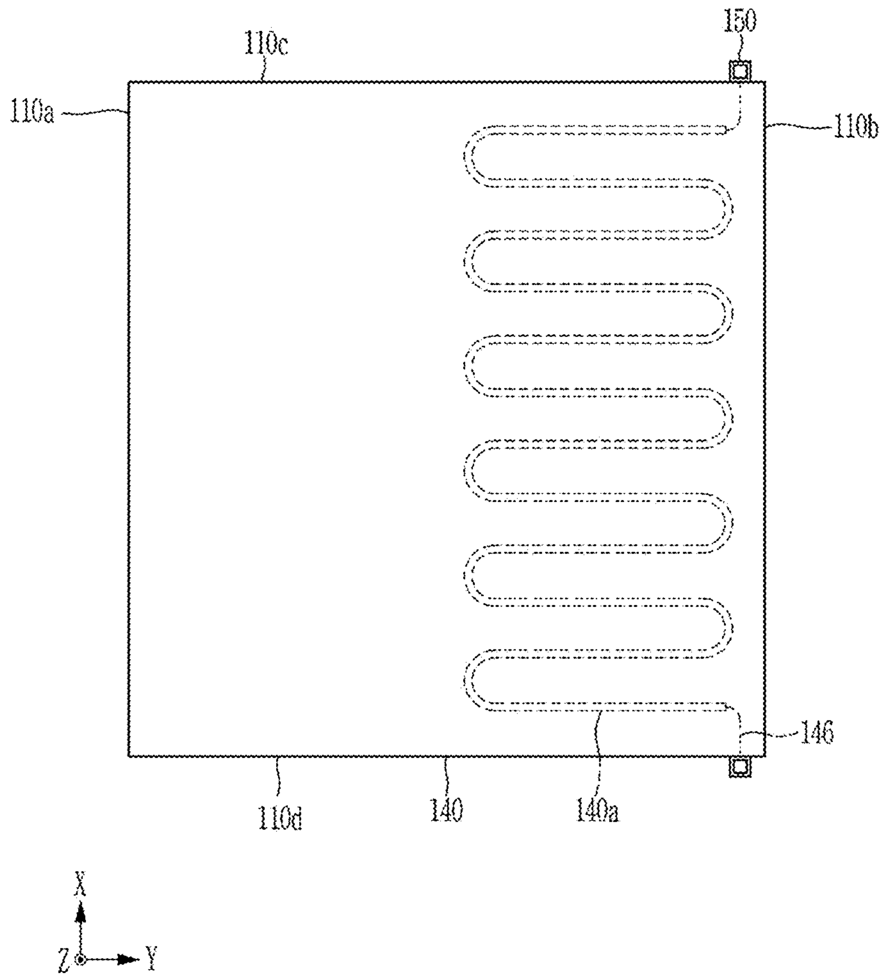
FIG. 8 is a plan view schematically illustrating a heating plate and a hinge member included in a burn-in board according to a modified embodiment.

In some example embodiments, as illustrated in FIG. 8, a heating portion 140*a* of a heating plate 140 may be in or may curve and/or serpentine only around a partial area of a substrate 110. FIG. 8 illustrates a portion corresponding to FIG. 7. For example, the heating portion 140*a* of the heating plate 140 may be partially positioned in a portion adjacent to a second side 110*b*. Thereby, a temperature of a portion, in which the temperature may be relatively low during the burn-in test, adjacent to the second side 110*b*, which is an opposite side to an inlet side, may be increased. For example, the temperature sensor 170 may detect a temperature of a portion adjacent to a first side 110*a* and the temperature of the portion adjacent to the second side 110*b* in real-time, and the heating portion 140*a* may be operated to increase the temperature of the portion adjacent to the second side 110*b* when the temperature of the portion adjacent to the second side 110*b* is lower than the temperature of the portion adjacent to the first side 110*a*. Thereby, the temperature difference of the substrate 110 may be reduced.

In some example embodiments, the heating portion 140*a* of the heating plate 140 may include portions having different integration degrees or different densities. For example, the heating portion 140*a* of the heating plate 140 may be more densely in a portion adjacent to a second side 110*b* than in a portion adjacent to a first side 110*a*. Thereby, a temperature of a portion, in which the temperature may be relatively low during a burn-in test, adjacent to the second side 110*b*, which is the opposite side to the inlet side, may be increased. For example, the temperature sensor 170 may detect a temperature of a portion adjacent to a first side 110*a* and the temperature of the portion adjacent to the second side 110*b* in real-time, and the heating portion 140*a* may be operated to increase the temperature of the portion adjacent to the second side 110*b* when the temperature of the portion adjacent to the second side 110*b* is lower than the temperature of the portion adjacent to the first side 110*a*. Thereby, the temperature difference of the substrate 110 may be reduced.

According to various example embodiments, the temperature uniformity of the substrate 110 may be improved in the burn-in test process by including the guide portion 118 that can control the flow of the air for the burn-in test. In this instance, the socket connector 122 is positioned so as not to block the flow of the air for the burn-in test, thereby further improving the temperature uniformity of the substrate 110. Further, the burn-in board 100 may be maintained to have a desired temperature in burn-in test process by the heating plate 140 and the temperature sensor 170. In this instance, when the guide portion 118, the heating portion 140*a*, and the temperature sensor 170 are included together, the temperature uniformity of the substrate 110 may be effectively improved in the burn-in test process.

The semiconductor device 20 mounted on the burn-in board 100 and to which a burn-in test is performed may be or may include (or be included in) a memory chip, a non-memory chip, or a merged semiconductor in which a memory portion and a non-memory portion are merged. In this instance, the memory chip may be or may include one or more of volatile memory (such as dynamic random access memory (DRAM), static random access memory (SRAM), or so on), or non-volatile memory (such as NAND flash memory system or so on). In some example embodiments, the semiconductor device 20 may be any of various semiconductor devices 20 to which a burn-in test is performed.

A burn-in test method according to various example embodiments will be described in detail with reference to FIG. 9 along with FIG. 1 to FIG. 8.

Figure 9:
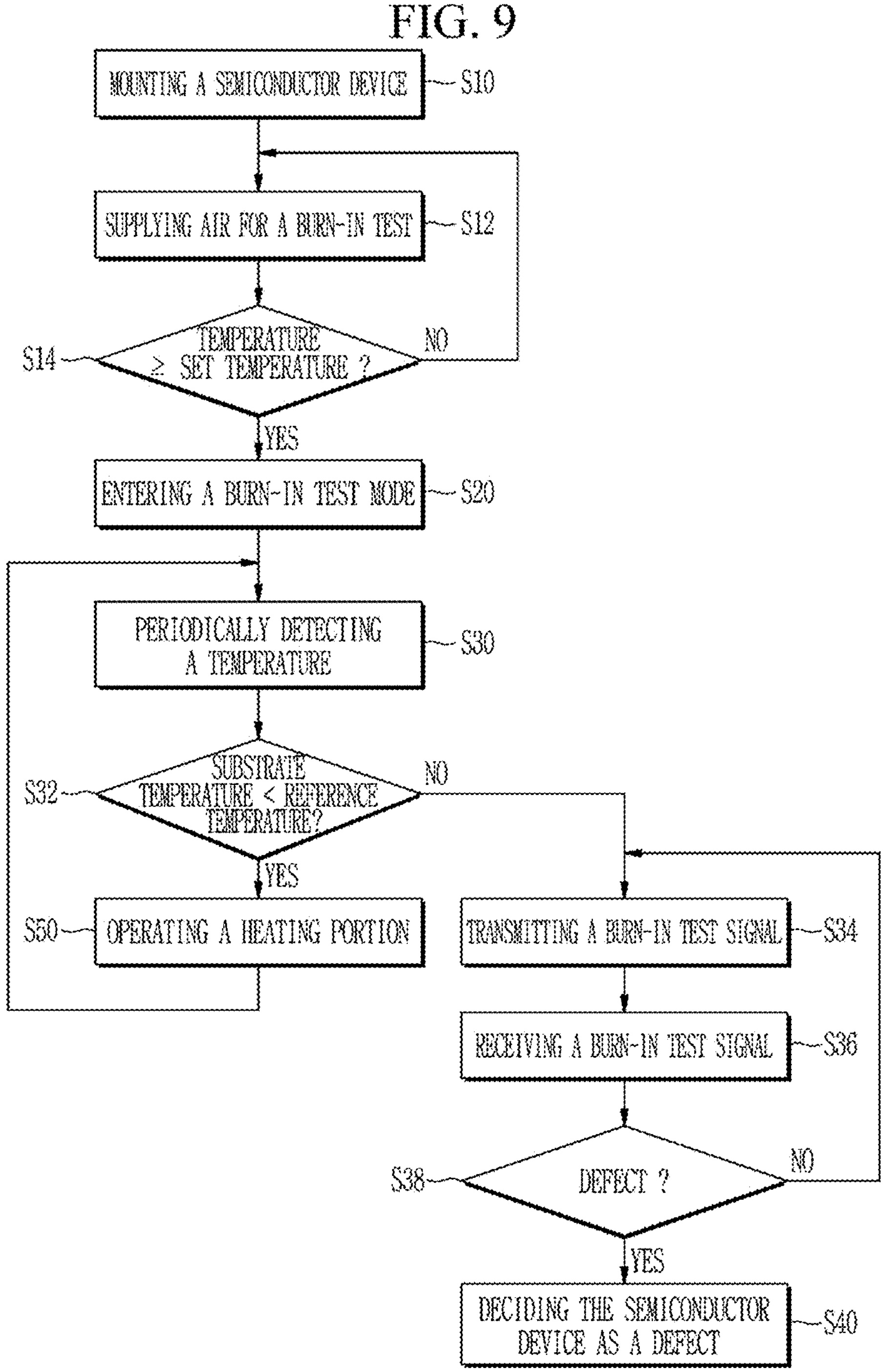
FIG. 9 is a flow chart illustrating a burn-in test method according to various example embodiments.

FIG. 9 is a flow chart illustrating a burn-in test method according to various example embodiments.

A semiconductor device 20 may be mounted on a burn-in test device 10 (S10).

More particularly, a burn-in board 100 may be prepared. The burn-in board 100 may include a substrate 110, a socket 120 on or at a first surface 111 of the substrate 110, and a heating plate 140 spaced apart from the surface 111 of the substrate 110 on the first surface 111 of the substrate 110.

Subsequently, the semiconductor device 20 may be mounted on the socket 120 of the burn-in board 100. In an open state in which the heating plate 140 is open, the semiconductor device 20 may be mounted on the socket 120 of the burn-in board 100 so that a lead 22 of the semiconductor device 20 is electrically connected to a socket connector 122. The heating plate 140 may be closed to prepare the burn-in board 100 of a closed state.

Subsequently, the burn-in board 100 on which the semiconductor device 20 is mounted may be inserted into a rack system 300, and a connection terminal 114 of the burn-in board 100 may be inserted into a slot 210 of a chamber 200.

When the burn-in board 100 is physically and electrically fixed to the chamber 200 in the above, the semiconductor device 20 may be mounted on the burn-in test device 10. At least a part of the process of mounting the semiconductor device 20 may be performed by an operator or by an auto guided vehicle under a control of a controller 400.

Air for a burn-in test may be supplied into the chamber 200 (S12). A space portion of the chamber 200 may be in a closed state closed by a shutter member.

Subsequently, it may be determined whether a temperature of the space portion of the chamber 200 or a temperature of the substrate 110 has reached a set temperature at which a burn-in test is performed (S14). The determination of whether the set temperature has been reached or not may be performed by using a temperature sensor 170 of the burn-in board 100 or a separate temperature sensor in the chamber 200.

If the temperature of the space portion of the chamber 200 or the temperature of the substrate 110 does not reach the set temperature at which the burn-in test is performed, the process of suppling the air for the burn-in test may continue to increase the temperature.

When the temperature of the space portion of the chamber 200 or the temperature of the substrate 110 reaches the set temperature at which the burn-in test is performed, the burn-in test device 10 may become or enter a burn-in test mode (S20).

In the burn-in test mode, the temperature sensor 170 may periodically detect a temperature of the burn-in board 100 (e.g., the substrate 110) (S30). For example, the controller 400 may transmit a periodic temperature detection command to the temperature sensor 170, and the temperature sensor 170 may receive the periodic temperature detection command and periodically detect the temperature of the substrate 110. The temperature of the substrate 110 periodically detected by the temperature sensor 170 may be transmitted to the controller 400.

The controller 400 may determine whether the temperature of the substrate 110 periodically detected by the temperature sensor 170 is lower than a reference temperature (S32). The reference temperature may refer to a minimum temperature of the substrate 110 to be maintained during the burn-in test.

If the temperature of the substrate 110 periodically detected by the temperature sensor 170 is the reference temperature or higher, a burn-in test may be performed. For example, a burn-in test signal may be transmitted (S34), a burn-in test signal (e.g., an output signal to the burn-in test signal) may be received (S36), and a defect of the semiconductor device 20 or not may be determined (S38). If the semiconductor device 20 is determined to have no defect in the burn-in test, the burn-in test may be continued. If the semiconductor device 20 is determined to have one or more defects in the burn-in test, the semiconductor device 20 may be decided to have at least one defect (S40).

When the temperature of the substrate 110 periodically detected by the temperature sensor 170 is lower than the reference temperature, the controller 400 may operate a heating portion **140*a* of a heating plate 140 (S50). As a result, the temperature of the substrate 110 may be increased and the temperature of the substrate 110** may be controlled.

The burn-in test being performed on the semiconductor device 20 may be continuously performed during the heating portion **140*a* operates. In some example embodiments, the burn-in test being performed on the semiconductor device 20 may be temporarily stopped during the heating portion 140*a* operates. The controller 400 may determine whether the temperature of the substrate 110 periodically detected by the temperature sensor 170 is lower than the reference temperature (S32) while operating the heating portion 140*a*, and proceed with the subsequent process. When the temperature of the substrate 110 is at a certain level (e.g., the reference temperature or higher), the controller 400 may stop the operation of the heating portion 140*a***.

When the burn-in test is completed, the burn-in board 100 on which the semiconductor device 20 is mounted is brought out from the chamber 200, the heating plate 140 is opened, and the semiconductor device 20 is separated from the socket 120. At least a part of the process of separating the semiconductor device 20 may be performed by an operator and/or by an auto guided vehicle under the control of the controller 400.

Figure 10:
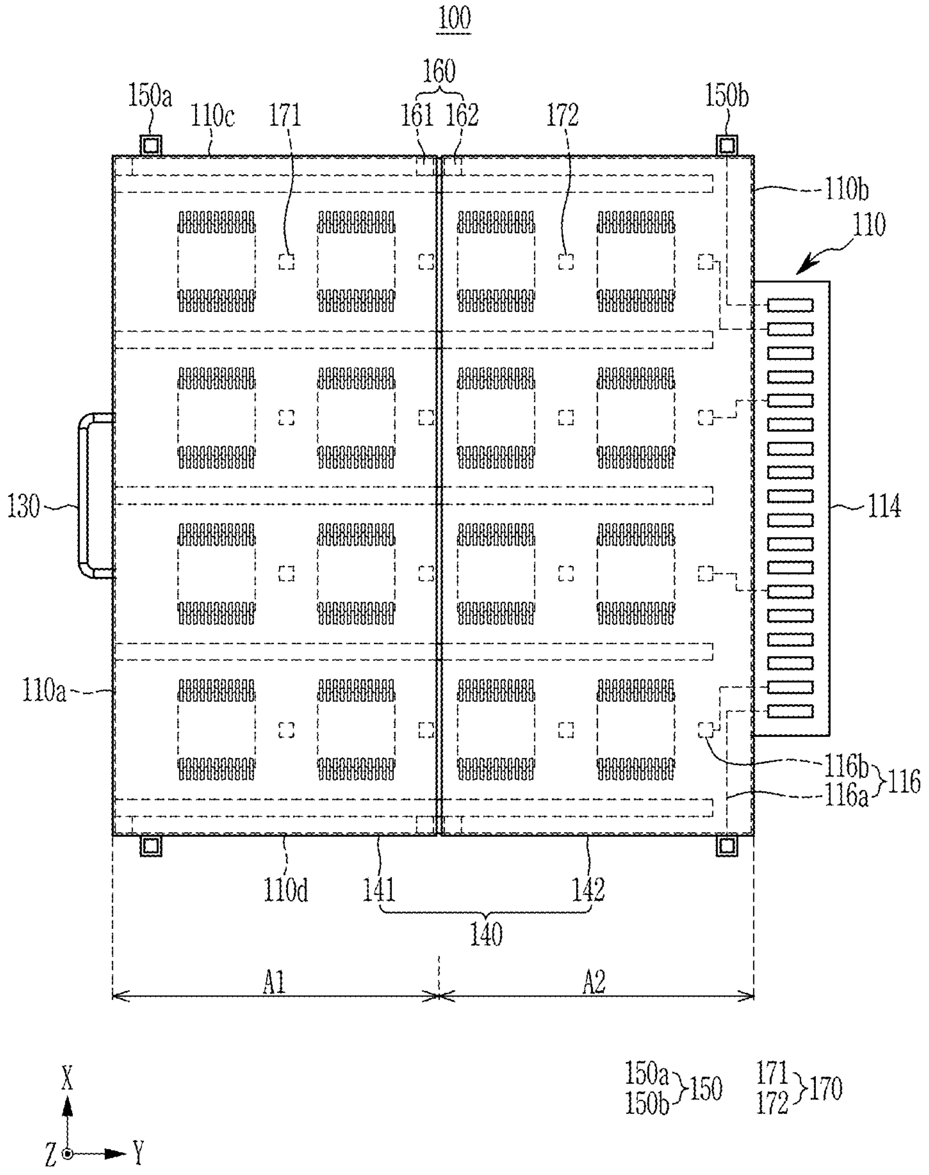
FIG. 10 is a plan view schematically illustrating a burn-in board according to various example embodiments.
Figure 11:
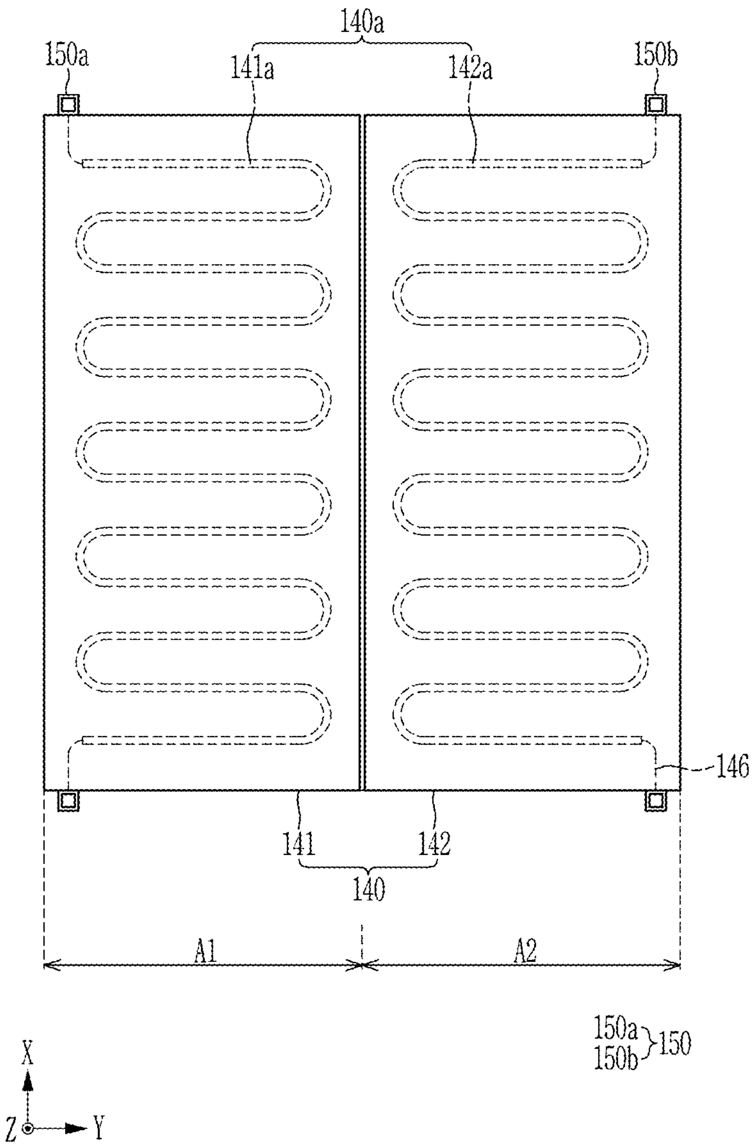
FIG. 11 is a plan view schematically illustrating a heating plate and a hinge member included in a burn-in board according to various example embodiments.

Hereinafter, a burn-in board and a burn-in test method using the same according to various example embodiments or a modified embodiment different from the above embodiment will be described in more detail with reference to FIG. 10 to FIG. 16. To the extent that an element is not described in detail below, it may be understood that the element is at least similar to a corresponding element that has been described elsewhere within the present disclosure FIG. 10 is a plan view schematically illustrating a burn-in board according to various example embodiments. FIG. 11 is a plan view schematically illustrating a heating plate and a hinge member included in a burn-in board according to the embodiment.

Referring to FIG. 10 and FIG. 11, in various example embodiments, a heating plate 140 or a heating portion **140*a* may include a plurality of heating plates 141 and 142 or a plurality of heating portions 141*a* and 142*a* to correspond to a plurality of areas A1 and A2 of a substrate 110, respectively. Hereinafter, it is described as an example that the heating plate 140 or the heating portion 140*a* may include first and second heating plates 141 and 142 or first and second heating portions 141*a* and 142*a* to correspond to first and second areas A1 and A2 of the substrate 110**, respectively.

In various example embodiments, a first hinge member **150*a* for rotatably fixing the first heating plate 141 may be adjacent to a first side 110*a* of the substrate 110, and a first support member 161 supporting the first heating plate 141 may be adjacent to a central portion. A second hinge member 150*b* for rotatably fixing the second heating plate 142 may be adjacent to a second side 110*b* of the substrate 110, and a second support member 162 supporting the second heating plate 142** may be adjacent to a central portion.

The first heating portion 141*a* of the first heating plate 141 may be electrically connected to a wiring 116 (e.g., a first wiring 116*a*) or a connection terminal 114 of the substrate 110 through the first hinge member 150*a*. The second heating portion 142*a* of the second heating plate 142 may be electrically connected to the wiring 116 (e.g., the first wiring 116*a*) or the connection terminal 114 of the substrate 110 through the second hinge member 150*b*. Accordingly, the first heating plate 141 (e.g., the first heating portion 141*a*) and the second heating plate 142 (e.g., the second heating portion 142*a*) may be controlled individually by a controller 400.

A temperature sensor 170 may include a plurality of temperature sensors 171 and 172 that are individually positioned to correspond to the plurality of areas A1 and A2 of the substrate 110. For example, the temperature sensor 170 may include a first temperature sensor 171 in the first area A1 and a second temperature sensor 172 in the second area A2. The first temperature sensor 171 and the second temperature sensor 172 may be electrically connected to the connection terminal 114 through the wirings 116 (e.g., second wirings 116*b*) of the substrate 110, respectively.

According to this, the plurality of temperature sensors 171 and 172 may detect temperatures of the plurality of areas A1 and A2 of the substrate 110 in real-time. The controller 400 may individually control the temperatures of the plurality of areas A1 and A2 of the substrate 110 through a feedback circuit between the plurality of heating portions 141*a* and 142*a* and the plurality of temperature sensor 170.

In this instance, the burn-in test temperatures of the plurality of areas A1 and A2 may be set or controlled through the controller 400 (e.g., burn-in software in the controller 400) by a user. The controller 400 may performs temperature detection in real-time through the temperature sensor 170, feedback between the temperature sensors 170 and the plurality of heating portions 140*a*, and temperature maintenance through the heating portions 140*a* through the burn-in software.

For example, burn-in tests at different temperatures may be performed through a single burn-in test by setting the burn-in test temperatures to be different in the plurality of areas A1 and A2. For example, in the burn-in test, the burn-in test temperatures of the plurality of areas A1 and A2 may be maintained to have a temperature difference of 25 degrees Celsius to 150 degrees Celsius. According to this, the burn-in test process may be simplified by performing burn-in tests at various burn-in test temperatures through a single burn-in test. In this instance, if a substandard area having a temperature lower than the reference temperature exists among the plurality of areas A1 and A2 of the substrate 110, a corresponding heating portion, among the plurality of heating portions 141*a* and 142*a*, corresponding to the substandard area is operated to increase the temperature of the substandard area.

In some example embodiments, a burn-in test may be performed at the same temperature in an entire area of the substrate 110. In this instance, if a substandard area having a temperature lower than the reference temperature exists among the plurality of areas A1 and A2 of the substrate 110, a corresponding heating portion, among the plurality of heating portions 141*a* and 142*a*, corresponding to the substandard area is operated to increase the temperature of the substandard area. As a result, a burn-in test may be performed at a uniform temperature in the entire area of the substrate 110.

In FIG. 10 and FIG. 11, it is illustrated as an example that the heating plate 140 includes the plurality of heating plates 141 and 142. According to this, the plurality of heating portions 140*a* individually provided on the plurality of heating plates 140 may be positioned without interfering with each other. However, example embodiments are not limited thereto.

Figure 12:
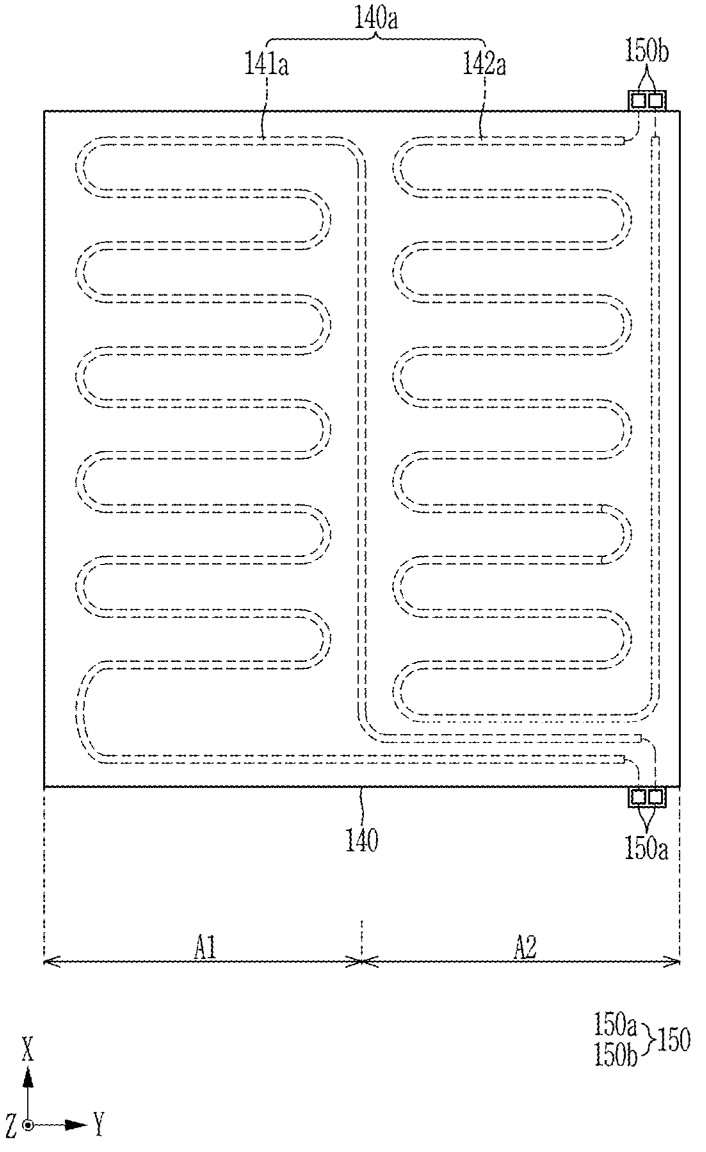
FIG. 12 is a plan view schematically illustrating a heating plate and a hinge member included in a burn-in board according to a modified embodiment.

In some example embodiments, as illustrated in FIG. 12, a heating plate 140 includes one heating plate, and a plurality of heating portions 140*a* whose operations may be individually controlled may be included in one heating plate. According to this, one heating plate is provided, and thus, an opening and closing operation of the heating plate 140 may be easily performed. In FIG. 12, it is illustrated as an example that a plurality of first hinge members 150*a* electrically connected to a first heating portion 141*a* are at a third side, and a plurality of second hinge member 150*b* electrically connected to a second heating portion 142*a* are at a fourth side. In this instance, the heating plate 140 may be rotatably fixed to one of the plurality of first hinge members 150*a* and one of the plurality of second hinge members 150*b*. An arrangement of the first hinge member 150*a*, the second hinge member 150*b*, and the plurality of heating portions 141*a* and 142*a* may be modified in various ways.

An example of a burn-in test method in the case of including a plurality of heating portions 140*a* or a plurality of heating plates 140 that may be individually controlled as described above will be described with reference to FIG. 13 along with FIG. 10 to FIG. 12.

Figure 13:
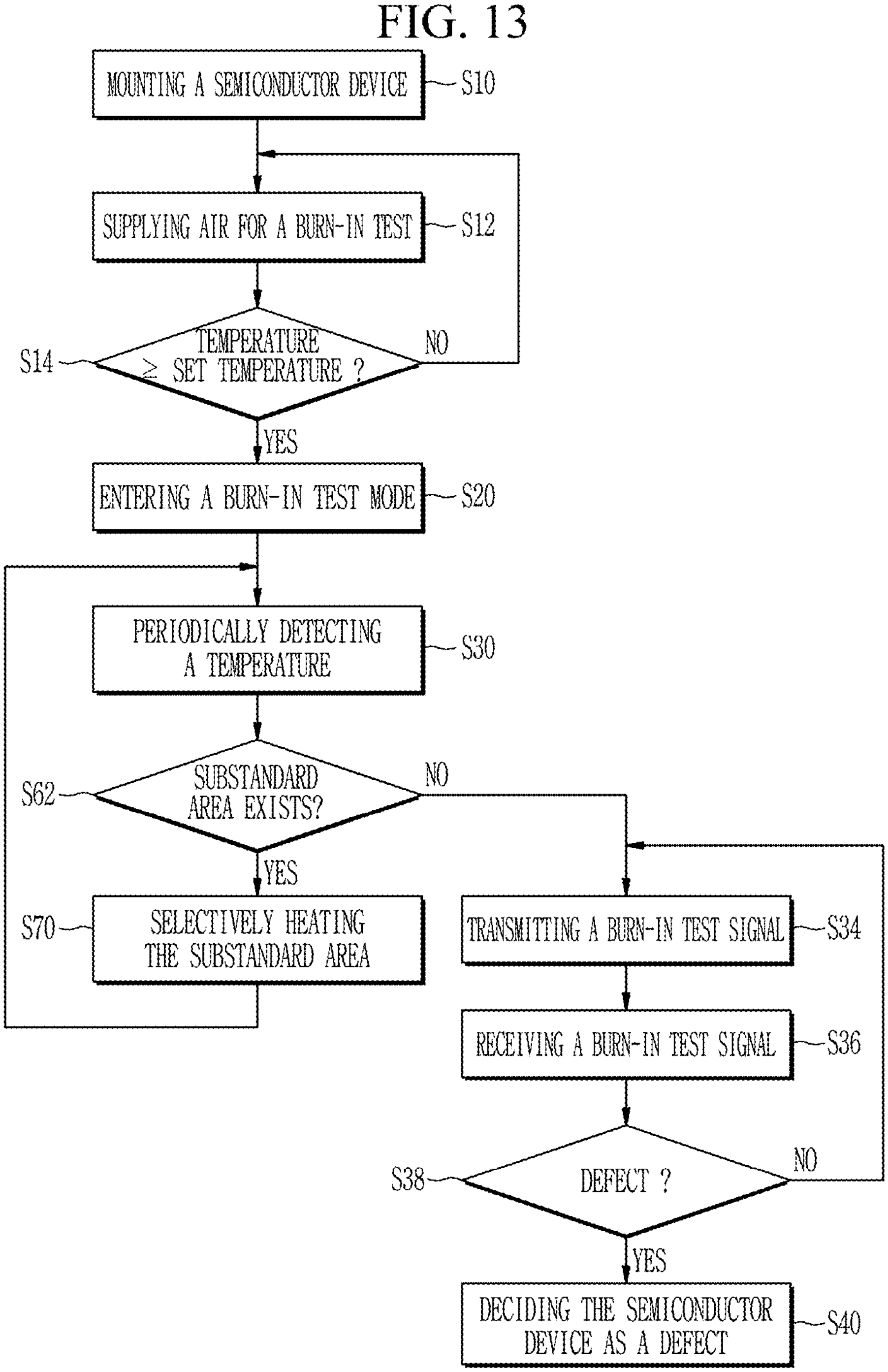
FIG. 13 is a flowchart illustrating a burn-in test method according to various example embodiments.

FIG. 13 is a flowchart illustrating a burn-in test method according to various example embodiments.

A semiconductor device 20 may be mounted on a burn-in test device 10 (S10), and air for a burn-in test may be supplied into a chamber 200 (S12). Subsequently, it may be determined whether a temperature of a space portion of the chamber 200 or a temperature of a substrate 110 has reached a set temperature at which a burn-in test is performed (S14).

If the temperature of the space portion of the chamber 200 or the temperature of the substrate 110 does not reach the set temperature at which the burn-in test is performed, the process of suppling the air for the burn-in test may continue to increase the temperature. In this instance, when burn-in test temperatures of a plurality of areas A1 and A2 of the substrate 110 are different from each other, at least a part of the plurality of heating portions 141*a* and 142*a* may be operated together to control the temperature of the substrate 110 so that the temperatures of the plurality of areas A1 and A2 correspond to the burn-in test temperatures.

When the temperature of the space portion of the chamber 200 and/or the temperature of the substrate 110 reaches the set temperature at which the burn-in test is performed, the burn-in test device 10 may become or enter a burn-in test mode (S20).

In the burn-in test mode, the temperature sensor 170 may periodically detect a temperature of the burn-in board 100 (e.g., the substrate 110) (S30). For example, the controller 400 may transmit a periodic temperature detection command to a plurality of temperature sensors 171 and 172, and the plurality of temperature sensors 171 and 172 may receive the periodic temperature detection command and periodically detect the temperatures of the substrate 110. The temperatures of the substrate 110 periodically detected by the plurality of temperature sensors 171 and 172 may be transmitted to the controller 400.

The controller 400 may determine whether a substandard area where a temperature of the substrate 110 is lower than a reference temperature exists (S62).

If the temperature of the substrate 110 periodically detected by the temperature sensor 170 is the reference temperature or higher, a burn-in test may be performed. For example, a burn-in test signal may be transmitted (S34), a burn-in test signal (e.g., an output signal to the burn-in test signal) may be received (S36), and a defect of a semiconductor device 20 or not may be determined (S38). If the semiconductor device 20 is determined to have no defect in the burn-in test, the burn-in test may be continued. If the semiconductor device 20 is determined to have the defect in the burn-in test, the semiconductor device 20 may be decided to have a defect (S40).

When the substandard area exists in the substrate 110, the controller 400 may selectively heat the substandard area by operating a corresponding heating portion 140*a* corresponding to the substandard area (S70). As a result, the temperature of the substandard area may be increased and the temperature of the substrate 110 may be controlled.

The burn-in test being performed on the semiconductor device 20 in the substandard area may be continuously performed during the heating portion 140*a* operates. In some example embodiments, the burn-in test being performed on the semiconductor device 20 in the substandard area may be temporarily stopped during the heating portion 140*a* operates. The controller 400 may continuously determine a temperature of the substandard area and a temperature of other portion or portions through the plurality of temperature sensors 171 and 172 while operating the corresponding heating portion 140*a*. When the temperature of the substandard area is at a certain level (e.g., the reference temperature or higher), the controller 400 may stop the operation of the corresponding heating portion 140*a*.

In some example embodiments, the controller 400 may individually control the plurality of heating portions 141*a* and 142*a* corresponding to the plurality of areas A1 and A2 of the burn-in board 100 so that the burn-in test temperatures of the plurality of areas A1 and A2 may be maintained to be different. In some embodiments, the controller 400 may maintain the same burn-in test temperature in the plurality of areas A1 and A2 of the burn-in board 100 by controlling the plurality of heating portions 141*a* and 142*a*.

When the burn-in test is completed, the burn-in board 100 on which the semiconductor device 20 is mounted is brought out from the chamber 200, the heating plate 140 is opened, and the semiconductor device 20 is separated from the socket 120. At least a part of the process of separating the semiconductor device 20 may be performed by an operator or by an auto guided vehicle under the control of the controller 400.

In the drawings and the above description, it is illustrated as an example that a number of heating plates 140 or heating portions 140*a* corresponding to one substrate 110 is two. However, example embodiments are not limited thereto. Three or more of heating plates 140 may be included.

Figure 14:
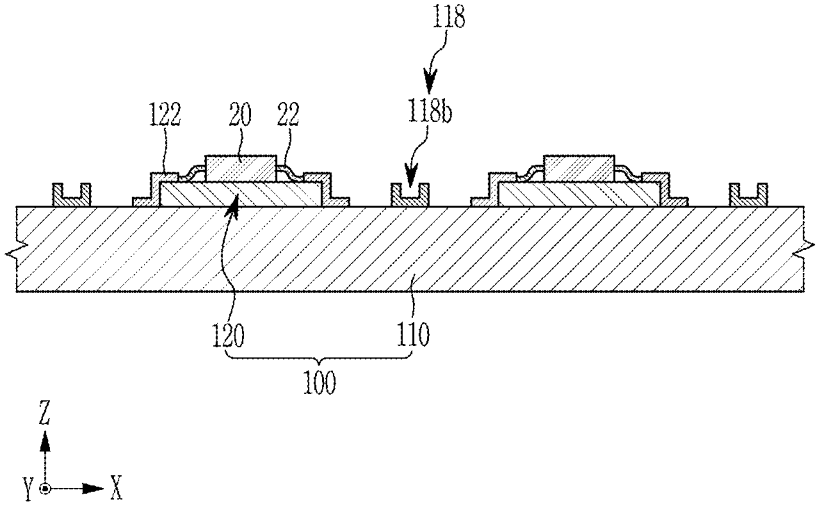
FIG. 14 is a cross-sectional view illustrating a state in which a semiconductor device is mounted on a burn-in board according to various example embodiments.

FIG. 14 is a cross-sectional view illustrating a state in which a semiconductor device is mounted on a burn-in board according to various example embodiments.

Referring to FIG. 14, a guide portion 118 according to various example embodiments may include or be formed of a guide structure 118*b* disposed on a first surface 111 of a substrate 110. For example, the guide portion 118 may be formed by attaching the guide structure 118*b* on the first surface 111 of the substrate 110 so that an inner space through which air for a burn-in test flows is provided on the first surface 111 of the substrate 110.

The guide structure 118*b* may include an extension portion extending in a first direction (a Y-axis direction in the drawing) as a groove 118*a* described with reference to FIG. 1 to FIG. 8, and a plurality of guide structures 118*b* may be provided in a second direction (an X-axis direction of the drawing). Unless otherwise described, the description of a guide portion 118 or a groove 118*a* with reference to FIG. 1 to FIG. 8 may be applied to the guide portion 118 or the guide structure 118*b* described with reference to FIG. 14 to FIG. 16.

In FIG. 14, it is illustrated as an example that the guide structure 118*b* has both side surfaces and a bottom surface to have an inner space formed by the both side surfaces and the bottom surface. According to this, the guide portion 118 may be easily formed between a plurality of sockets 120 by attaching the guide structure 118*b* on the substrate 110.

Figure 15:
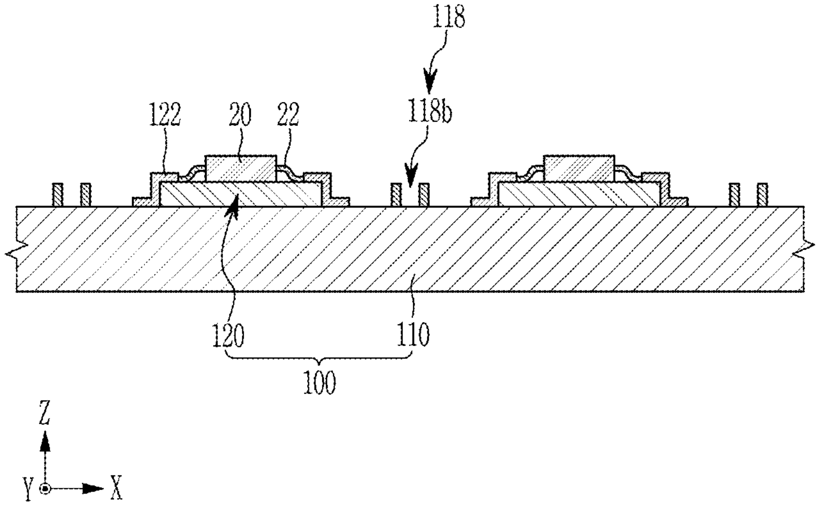
FIG. 15 is a cross-sectional view illustrating a state in which a semiconductor device is mounted on a burn-in board according to a modified embodiment.

In some example embodiments, as illustrated in FIG. 15, a guide structure 118*b* may include a plurality of protrusions (e.g., two protrusions) attached on a first surface 111 of a substrate 110. The guide structure 118*b* may have a shape having both side surfaces and no bottom surface of the guide structure 118*b* illustrated in FIG. 14.

Figure 16:
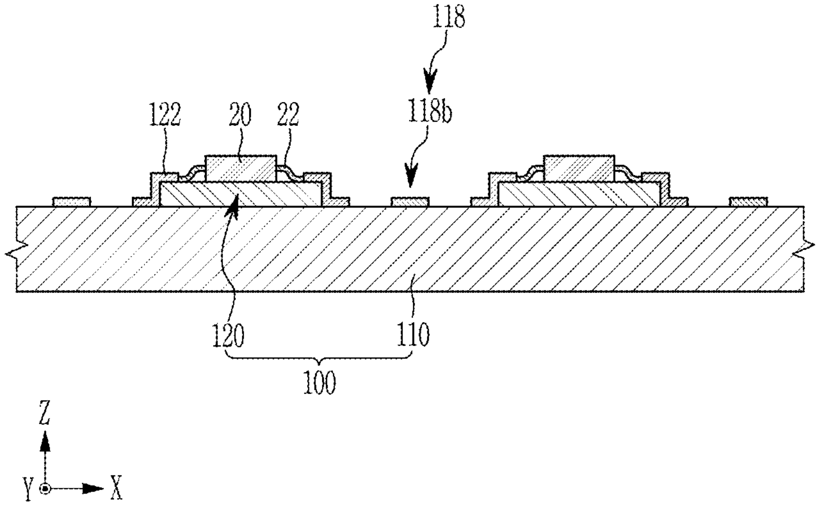
FIG. 16 is a cross-sectional view illustrating a state in which a semiconductor device is mounted on a burn-in board according to a modified embodiment.

In some example embodiments, as illustrated in FIG. 16, a guide structure 118*b* may include one protrusion attached on a first surface 111 of a substrate 110. In this instance, an inner space may be between guide structures 118*b* at both sides of one socket 120 in a second direction (an X-axis direction in the drawing). For example, a portion where the socket 120 is positioned may correspond to the inner space of the guide structure 118*b* or a guide portion 118. According to this, air for a burn-in test (e.g., high-temperature air) may be effectively provided to the portion where the socket 120 is positioned. As a result, the temperature in the portion where the socket 120 is positioned may be effectively increased.

While some examples have been described in connection with what is considered to be various example embodiments, it is to be understood that inventive concepts are not limited, and that that inventive concepts are intended to cover various modifications and equivalent arrangements included within the spirit and scope of the appended claims. Further example embodiments are not necessarily mutually exclusive with one another. For example, some example embodiments may include one or more features described with reference to one or more figures, and may also include one or more other features described with reference to one or more other figures.

What is claimed is:

1. A burn-in board, comprising:
- a substrate having a first surface and a second surface opposite to each other; and
- a plurality of sockets arranged in rows, each of the plurality of sockets configured to receive a semiconductor device on or at the first surface of the substrate,
- wherein the burn-in board defines a guide portion between the rows of the plurality of sockets, the guide portion including an extension portion extending in a first direction and having an inner space for a channel on or at the first surface of the substrate, the channel enabling flow of air for a burn-in test.

2. The burn-in board of claim 1, wherein the guide portion or the extension portion extends from an inlet side to an opposite side opposite to the inlet side.

3. The burn-in board of claim 1, wherein
- the plurality of sockets are arranged in a second direction transverse to the first direction in a plan view,
- the guide portion is an inner guide portion between two sockets of the plurality of sockets adjacent to each other in the second direction, and an outer guide portion between one socket of the plurality of sockets and an edge of the substrate is further included in the burn-in board.

4. The burn-in board of claim 1, wherein the guide portion includes a groove having the inner space on or at the first surface of the substrate.

5. The burn-in board of claim 1, wherein the guide portion includes a guide structure on the first surface of the substrate.

6. The burn-in board of claim 1, wherein a width of the inner space is greater than a depth of the inner space.

7. The burn-in board of claim 1, further comprising:

a heating plate on the first surface of the substrate and spaced apart from the first surface of the substrate.

8. The burn-in board of claim 7, further comprising:

a hinge member fixed to a side surface of the substrate and a side surface of the heating plate, wherein the heating plate is rotatably mounted to the hinge member; and a support member configured to support the heating plate on the first surface of the substrate.

9. The burn-in board of claim 8, wherein the heating plate is electrically connected to a wiring of the substrate through the hinge member.

10. The burn-in board of claim 1, further comprising:

a temperature sensor on or in the substrate, wherein the temperature sensor is electrically connected to a wiring of the substrate.

11. The burn-in board of claim 1, further comprising:

a heating plate on the first surface of the substrate and spaced apart from the first surface of the substrate, wherein the heating plate includes a plurality of heating portions corresponding to a plurality of areas of the substrate, respectively.

12. The burn-in board of claim 11, further comprising:

a temperature sensor on or in the substrate, wherein the temperature sensor includes a plurality of temperature sensors corresponding to the plurality of areas of the substrate, respectively.

13. The burn-in board of claim 1, wherein each of the plurality of sockets includes a socket connector, and the socket connector is at an edge of a socket parallel to the first direction.

14. A burn-in board, comprising:

a substrate having a first surface and a second surface opposite to each other;

a socket configured to receive a semiconductor device on or at the first surface of the substrate; and a heating plate on the first surface of the substrate and spaced apart from the first surface of the substrate, wherein the heating plate includes a plurality of heating portions provided separately to correspond to a plurality of areas of the substrate, respectively.

15. The burn-in board of claim 14, further comprising:

a hinge member fixed to a side surface of the substrate and a side surface of the heating plate, wherein the heating plate is rotatably to the hinge member; and a support member configured to support the heating plate on the first surface of the substrate.

16. The burn-in board of claim 14, further comprising:

a temperature sensor on or in the substrate, wherein the temperature sensor is electrically connected to a wiring of the substrate.

17. The burn-in board of claim 16, wherein the temperature sensor includes a plurality of temperature sensors corresponding to the plurality of areas of the substrate, respectively.

18. A burn-in test method, comprising:

placing a burn-in board including a heating plate and a substrate on which a semiconductor device is mounted in a burn-in test apparatus the substrate defining a channel on or at a first surface of the substrate, the channel extending in a first direction; and performing a burn-in test of the semiconductor device in a state that air for the burn-in test is supplied through the channel, wherein, in the burn-in test, the method includes detecting a temperature of the substrate, and operating the heating plate in response to the temperature of the substrate being lower than a reference temperature, the heating plate increasing the temperature of the substrate.

19. The burn-in test method of claim 18, wherein the heating plate includes a plurality of heating portions corresponding to a plurality of areas of the substrate, respectively, and in the burn-in test, in response to a substandard area having a temperature lower than a reference temperature existing among the plurality of areas, the method includes operating a corresponding heating portion, among the plurality of heating portions, corresponding to the substandard area to selectively increase the temperature of the substandard area.

20. The burn-in test method of claim 18, wherein the heating plate includes a plurality of heating portions corresponding to a plurality of areas of the substrate, respectively, and in the burn-in test, the method includes operating at least two of the plurality of heating portions individually to maintain burn-in test temperatures of the at least two of the plurality of areas to be different.

* * * * *